US012301227B2

(12) United States Patent
Shaeffer

(10) Patent No.: US 12,301,227 B2
(45) Date of Patent: May 13, 2025

(54) ON-DIE TERMINATION

(71) Applicant: Rambus Inc., San Jose, CA (US)

(72) Inventor: Ian Shaeffer, Los Gatos, CA (US)

(73) Assignee: Rambus Inc., San Jose, CA (US)

( * ) Notice: Subject to any disclaimer, the term of this patent is extended or adjusted under 35 U.S.C. 154(b) by 146 days.

(21) Appl. No.: 18/347,376

(22) Filed: Jul. 5, 2023

(65) Prior Publication Data

US 2024/0039536 A1 Feb. 1, 2024

Related U.S. Application Data

(63) Continuation of application No. 17/527,511, filed on Nov. 16, 2021, now Pat. No. 11,742,855, which is a continuation of application No. 16/880,208, filed on May 21, 2020, now Pat. No. 11,206,020, which is a continuation of application No. 16/425,406, filed on May 29, 2019, now Pat. No. 10,680,612, which is a continuation of application No. 16/011,518, filed on Jun. 18, 2018, now Pat. No. 10,333,519, which is a continuation of application No. 15/629,265, filed on Jun. 21, 2017, now Pat. No. 10,014,860, which is a (Continued)

(51) Int. Cl.

| | |
|---|---|
| ***H03K 19/00*** | (2006.01) |
| ***G11C 5/06*** | (2006.01) |
| ***G11C 5/14*** | (2006.01) |
| ***G11C 7/10*** | (2006.01) |
| ***G11C 11/4063*** | (2006.01) |
| ***G11C 11/413*** | (2006.01) |
| ***G11C 16/06*** | (2006.01) |
| ***H03K 19/0175*** | (2006.01) |

(52) U.S. Cl.

CPC ......... *H03K 19/0005* (2013.01); *G11C 5/063* (2013.01); *G11C 5/14* (2013.01); *G11C 7/1084* (2013.01); *G11C 11/4063* (2013.01); *G11C 11/413* (2013.01); *G11C 16/06* (2013.01); *H03K 19/017545* (2013.01)

(58) Field of Classification Search

CPC ....... H03K 19/0005; H03K 19/017545; G11C 5/063; G11C 5/14; G11C 7/1084; G11C 11/4063; G11C 11/413; G11C 16/06

See application file for complete search history.

(56) References Cited

U.S. PATENT DOCUMENTS 6,834,014 B2 12/2004 Yoo et al.
6,917,546 B2 * 7/2005 Matsui ................ G11C 7/1063 365/198

(Continued)

OTHER PUBLICATIONS

International Search Report and Written Opinion mailed May 4, 2012 re Int'l Application No. PCT/US12/022083. 9 pages.

*Primary Examiner* — Daniel D Chang

(74) *Attorney, Agent, or Firm* — Silicon Edge Law Group LLP; Arthur J. Behiel

(57) ABSTRACT

Local on-die termination controllers for effecting termination of a high-speed signaling links simultaneously engage on-die termination structures within multiple integrated-circuit memory devices disposed on the same memory module, and/or within the same integrated-circuit package, and coupled to the high-speed signaling link. A termination control bus is coupled to memory devices on a module, and provides for peer-to-peer communication of termination control signals.

20 Claims, 15 Drawing Sheets

Related U.S. Application Data continuation of application No. 15/187,861, filed on Jun. 21, 2016, now Pat. No. 9,705,498, which is a continuation of application No. 14/619,342, filed on Feb. 11, 2015, now Pat. No. 9,385,719, which is a continuation of application No. 13/984,825, filed as application No. PCT/US2012/022083 on Jan. 20, 2012, now Pat. No. 8,988,102.

(60) Provisional application No. 61/438,757, filed on Feb. 2, 2011.

(56) References Cited

U.S. PATENT DOCUMENTS

| | | | |
|---|---|---|---|
| 7,113,418 | B2 | 9/2006 | Oberlin et al. |
| 7,259,585 | B2 | 8/2007 | Brinkman et al. |
| 7,486,104 | B2 | 2/2009 | Oh et al. |
| 7,516,281 | B2 | 4/2009 | LaBerge |
| 7,539,826 | B2 | 5/2009 | Chae et al. |
| 7,582,960 | B2 | 9/2009 | Karnezos |
| 7,617,367 | B2 | 11/2009 | Campbell et al. |
| 7,786,752 | B2 | 8/2010 | Oh et al. |
| 7,961,532 | B2 | 6/2011 | Ware |
| 8,188,762 | B2 | 5/2012 | Oh et al. |
| 8,369,164 | B2 | 2/2013 | Ware |
| 8,422,263 | B2 | 4/2013 | Saito et al. |
| 8,588,012 | B2 | 11/2013 | Wilson et al. |
| 8,610,455 | B2 | 12/2013 | Oh et al. |
| 8,610,459 | B2 | 12/2013 | Oh et al. |
| 8,619,492 | B2 | 12/2013 | Jeon |
| 8,688,955 | B2 | 4/2014 | Grunzke |
| 8,988,102 | B2 | 3/2015 | Shaeffer |
| 9,337,835 | B2 | 5/2016 | Oh et al. |
| 9,385,719 | B2 | 7/2016 | Shaeffer |
| 9,529,713 | B2 | 12/2016 | Grunzke |
| 9,660,648 | B2 | 5/2017 | Oh et al. |
| 9,721,629 | B2 | 8/2017 | Shaeffer et al. |
| 9,740,269 | B1 | 8/2017 | Tatapudi et al. |
| 9,748,956 | B2 | 8/2017 | Lee et al. |
| 10,056,902 | B2 | 8/2018 | Oh et al. |
| 10,270,442 | B2 | 4/2019 | Oh et al. |
| 10,333,519 | B2 | 6/2019 | Shaeffer |
| 11,245,397 | B2 | 2/2022 | Lee et al. |
| 2003/0043683 | A1 | 3/2003 | Funaba et al. |
| 2003/0126338 | A1 * | 7/2003 | Dodd .................. G06F 13/4086 710/305 |
| 2004/0228196 | A1 | 11/2004 | Kwak et al. |
| 2009/0273960 | A1 | 11/2009 | Kim et al. |
| 2009/0303768 | A1 | 12/2009 | Nishio et al. |
| 2010/0013516 | A1 | 1/2010 | Kyung |
| 2010/0030934 | A1 | 2/2010 | Bruennert et al. |
| 2010/0232196 | A1 | 9/2010 | Jo et al. |
| 2011/0314200 | A1 | 12/2011 | Wilson et al. |
| 2021/0175887 | A1 | 6/2021 | Hiemstra et al. |

* cited by examiner

210

| | Module 1 Termination | | Module 2 Termination | |
|---|---|---|---|---|
| **Write Target** | **Rank A** | **Rank B** | **Rank A** | **Rank B** |
| Module 1, Rank A | R2 ($R_{Soft}$) | Off | R1 ($2R_{Hard}$) | R1 ($2R_{Hard}$) |
| Module 1, Rank B | Off | R2 ($R_{Soft}$) | R1 ($2R_{Hard}$) | R1 ($2R_{Hard}$) |
| Module 2, Rank A | R1 ($2R_{Hard}$) | R1 ($2R_{Hard}$) | R2 ($R_{Soft}$) | Off |
| Module 2, Rank B | R1 ($2R_{Hard}$) | R1 ($2R_{Hard}$) | Off | R2 ($R_{Soft}$) |

280

| | Module Termination | |
|---|---|---|
| **Write Target** | **Rank A** | **Rank B** |
| Rank A | R1 ($2R_{Soft}$) | R1 ($2R_{Soft}$) |
| Rank B | R1 ($2R_{Soft}$) | R1 ($2R_{Soft}$) |

| TC2 | TC1 | ODT |
|---|---|---|
| 0 | 0 | Off |
| 0 | 1 | R1 |
| 1 | 0 | R2 |
| 1 | 1 | Reserved |

380

| | Module 1 Termination | | Module 2 Termination | |
|---|---|---|---|---|
| **Write Target** | **Rank A** | **Rank B** | **Rank A** | **Rank B** |
| Module 1, Rank A | R2 ($2R_{Soft}$) | R2 ($2R_{Soft}$) | R1 ($2R_{Hard}$) | R1 ($2R_{Hard}$) |
| Module 1, Rank B | R2 ($2R_{Soft}$) | R2 ($2R_{Soft}$) | R1 ($2R_{Hard}$) | R1 ($2R_{Hard}$) |
| Module 2, Rank A | R1 ($2R_{Hard}$) | R1 ($2R_{Hard}$) | R2 ($2R_{Soft}$) | R2 ($2R_{Soft}$) |
| Module 2, Rank B | R1 ($2R_{Hard}$) | R1 ($2R_{Hard}$) | R2 ($2R_{Soft}$) | R2 ($2R_{Soft}$) |

ON-DIE TERMINATION

TECHNICAL FIELD

The present invention relates generally to the field of electronic communications and more particularly to signaling between integrated circuit devices.

BACKGROUND

On-die termination (ODT) is commonly used to terminate high-speed data links in modern integrated-circuit (IC) memory devices. Unfortunately, the signaling current flows through the IC package inductance (i.e., formed by conductive structures within the IC package such as vias, wire-bonds, etc.) before reaching the on-die termination, and thus tends to create data-dependent switching noise that is transferred to the power rails and thus to neighboring signaling links, reducing the net signal-to-noise ratio (SNR) within the system.

In addition, in memory systems including many memory devices, control of ODT is typically provided by memory controllers. This requires logic and pins on the memory controllers, increasing complexity of already complex devices. Also, this typical arrangement requires ODT signal lines from the controllers to each device in the system, increasing layout complexity and area of circuit boards for the systems.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1:
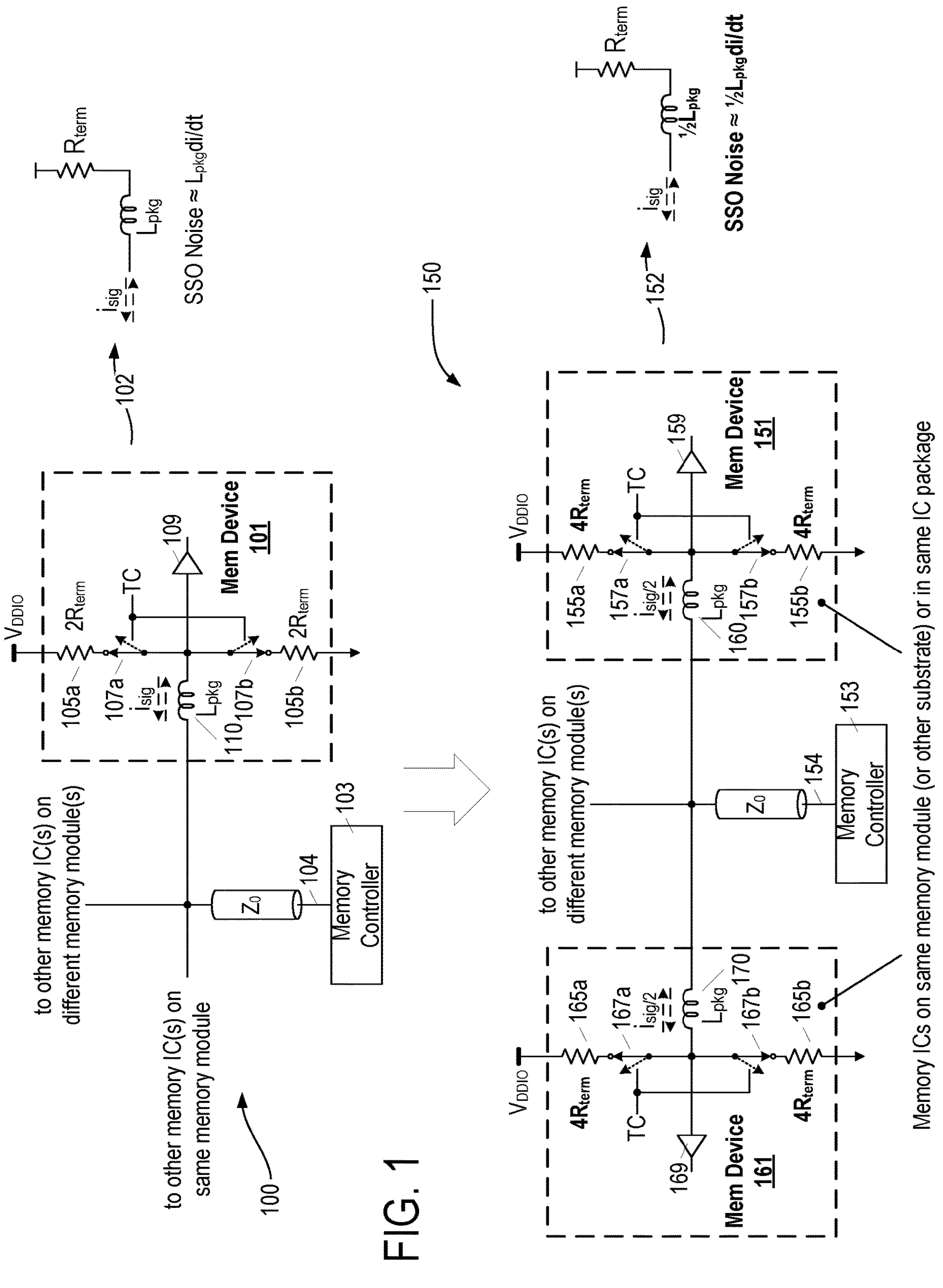
FIG. 1 contrasts a legacy single-device termination mode with an exemplary cooperative, multi-device termination mode.

In various embodiments disclosed herein, termination of a high-speed signaling link is effected by cooperative on-die termination within multiple integrated-circuit memory devices coupled to the high-speed signaling link in a peer configuration, such as for example multiple memory devices disposed on the same memory module (or other substrate, and/or disposed within the same integrated-circuit package) or multiple memory devices disposed in proximity on a motherboard as in a die-down structure. A peer configuration for the purposes of the present description is one in which connections of the memory devices to a shared high-speed signaling link are in close enough proximity that cooperative termination loads can be beneficially applied.

By enabling on-die termination cooperatively within multiple memory devices coupled in common to the high-speed signaling link, data-dependent switching noise is substantially reduced as the signaling current is split between or among the multiple memory devices and thus flows through a substantially reduced net package inductance. The reduced switching noise improves system power integrity (i.e., reduces noise transference via the power rails), and thus reduces margin-degrading cross-talk and timing jitter, yielding an overall improved signaling margin that may permit faster signaling rates and relaxed system design. In addition, peer to peer communication of on-die termination control signals can be implemented among peer devices arranged for cooperative termination, reducing the number of communication lines to a memory controller for the memory devices.

An integrated circuit device with memory operable in a plurality of operating modes, can include an on-die termination controller, coupled with circuitry to sense a peer termination control signal asserted by another device, circuitry to drive a peer termination control signal off chip for another device, and circuitry to effect on-die termination in response to the plurality of operating modes and to sensed peer termination control signals. The circuitry to effect on-die termination can be configured for a variety of implementations. In one implementation the circuitry to effect on-die termination coupled with the local on-die termination controller includes circuitry to (i) apply a first termination load in a first state such as for establishing a cooperative termination for a write operation to the device or to a peer device, and (ii) disable the on-die termination in a second state such as for a read operation to the device or to a peer device. In another implementation the circuitry to effect on-die termination includes circuitry to (i) apply a first termination load in a first state such as for establishing cooperative termination with a peer device during an operation directed to other devices on the high-speed signaling link, (ii) apply a second termination load in a second state such as for establishing a cooperative termination for a write operation to the device or to a peer device, and (iii) disable the on-die termination in a third state.

A memory apparatus as described herein can comprise a plurality of memory devices and a termination control bus arranged for peer-to-peer communication of termination control signals, memory devices in the plurality including local on-die termination controllers to determine when to drive a line on the termination control bus coupled to other memory devices in the plurality and when to effect on-die termination.

A memory as device described herein can include a local on-die termination controller to determine when to drive a control pin with a termination control signal, and when to effect on-die termination.

FIG. 1 contrasts a legacy single-device termination mode with an exemplary cooperative, multi-device termination mode. In the single-device termination mode, shown generally at 100, on-die termination elements 105*a*, 105*b* are engaged (i.e., by operation of switch elements 107*a*, 107*b* in response to a termination control signal, TC) within a memory device 101 of a given memory module or other substrate, thereby coupling a net on-die termination load of $R_{term}$ to a signaling link 104 extending between memory controller 103 and memory device 101. In parallel with this on-die termination load, package inductance arises for example from parasitic inductance that may result from package-to-memory-module interconnects as well as intra-package wiring structures including traces, vias, die-interconnects. Consequently, a signaling current, '$i_{sig}$' flows through the package inductance $L_{pkg}$ before flowing through the pull-up and pull-down termination elements 105*a*, 105*b* to develop a detectable signal voltage at the input of receiver 109. The termination elements 105*a*, 105*b* are depicted in the figure as $2R_{term}$, but are effectively disposed in parallel from a small-signal or AC perspective and thus equivalent to $R_{term}$; i.e., the product ($2R_{term}$*$2R_{term}$) divided by the sum ($2R_{term}$+$2R_{term}$).

By contrast, in the cooperative, multi-device termination mode shown at 150, on-die termination elements 155*a*, 155*b*, 165*a*, 165*b* are engaged (i.e., coupled via switching elements 157*a*, 157*b*, 167*a*, 167*b* to an on-die portion of signaling link 154 in response to termination signal(s), TC) in two memory devices 151, 161 mounted in a peer configuration, such as on a single memory module, with the effective termination load within each memory device having twice the resistance (or impedance) of the desired termination load (i.e., $4R_{term}$ pull-up and $4R_{term}$ pull-down in each memory device and thus an effective resistance of $2R_{term}$ in each memory device) to establish a net desired termination load, $R_{term}$, that is balanced or shared between the two memory devices 151 and 161. Consequently in a balanced peer configuration, half of the signaling current, $i_{sig/2}$, flows through the package inductance of each of the two memory devices 151, 161, in effect halving the net package inductance through which the net signal current flows and thus halving the overall data-dependent switching noise produced by the signal termination. That is, because the simultaneous-switching output (SSO) noise is largely or at least partly a function of data-dependent changes in the direction and/or level of the signaling current flowing through the net package inductance (i.e., SSO noise approximated by $L_{pkgdi/dt}$), the SSO noise may be effectively halved by the balanced termination approach which halves the net package inductance through which the signaling current flows. This noise reduction may be appreciated by comparing the termination circuit models shown at 102 and 152 for the single-device and multi-device termination modes, respectively. The cooperative termination may also reduce signal reflection amplitude relative to conventional termination approaches and thus yield improved timing and voltage margins over and above the benefits resulting from the lowered SSO noise. In configurations with more than 2 peer devices, cooperative termination can also effectively reduce SSO noise.

As shown, the terminated signaling link 154 may be modeled as a transmission line having characteristic impedance, Zo, and extending at least from memory controller 153 to the memory module on which memory ICs 151 and 161 are disposed. Although not specifically shown, the overall signaling channel between the memory controller and memory ICs 151 and 161 may include numerous such signaling links, each of which may be a bidirectional link (e.g., for conveying read data from memory devices 151, 161 to memory controller 153 and write data from memory controller 153 to the memory devices 151, 161) or a unidirectional link (e.g., for conveying control/address/timing information from the memory controller to the memory devices). In a single module-slot embodiment, the memory system has only one memory-module slot (or connector or other structure for connecting a memory module to the links and, in preferred examples, to permit insertion/removal of a memory module), and thus may be expanded only by replacing an existing memory module with a higher-capacity (and/or higher bandwidth) memory module. In alternative embodiments, the memory system includes multiple memory-module slots, each coupled in parallel to the signaling link at a different point along its length, for example, or in a star configuration. Such multi-slot embodiments are indicated in FIG. 1 by the reference "to other Memory IC(s) on different memory module(s)."

Memory devices 151 and 161 are depicted in FIG. 1 as being disposed (or situated) on the same memory module and, as discussed below, are assumed to be more specifically disposed immediately opposite one another on front and back surfaces of a memory module substrate. Thus, the distance between the commonly coupled input/output nodes of the two memory devices is quite small (i.e., relative to the distance between memory devices disposed on different memory modules) and the physical location of the two devices relative to one another is intended to be unchangeable (i.e., the devices are not intended to be movable relative to one another, in contrast to devices on respective memory modules each of which may be removed and reinserted in different module slots). The two memory devices 151 and 161 may alternatively (or additionally) be secured in fixed, proximal position relative to each other within a common IC package (e.g., the memory devices being respective memory ICs stacked or disposed collaterally within an IC package) or disposed within respective IC packages that are themselves stacked or otherwise affixed proximally to one another. Also, the two memory devices 151 and 161 may be disposed adjacent one another on the same surface or opposite surfaces (i.e., in a clam-shell arrangement with the substrate sandwiched between the two memory devices) of a motherboard, daughterboard (e.g., graphics card, line card, etc.) or any other chip-mounting substrate. The cooperative termination shown at 150 of FIG. 1 and implementations and alternatives thereof in other embodiments disclosed below are presented primarily with respect to memory devices disposed on the same memory module. More generally, the structures and methods disclosed may be employed in virtually any memory device arrangement in which the two or more memory devices (which may be IC dice or respective IC packages) are arranged in a peer configuration. A peer configuration can include multiple devices jointly enabled to terminate a given signal line and disposed in sufficiently close proximity that the net inductance of the termination is reduced (and/or other characteristics of the signaling link improved) by the multi-device on-die termination relative to the net inductance (or other signaling link characteristic) of a termination employing only one of the memory devices. For example, the jointly terminating memory devices may be limited to physical disposition within 5, 10 or 15 millimeters of one another, though smaller or larger distance limits may apply; or limited to a physical interconnection in which the inductance of the trace(s) and/or other interconnection structure(s) coupled between the multiple memory devices is, for example, less than 2, 3, 4 or 5 times the package/die inductance of the memory devices themselves, though larger or smaller inductance ratios may apply. Further, while the termination techniques are described in connection with memory devices (i.e., integrated circuit devices having a substantial array of storage cells for volatile and/or non-volatile storage of data within an electronic system or appliance, including for example and without limitation, static, dynamic and all other forms of random access memory, as well as flash and all forms of non-volatile memory), all such termination techniques may also be employed with respect to other types of integrated circuit devices in which on-die-terminated signaling may be carried out including, without limitation, buffer ICs disposed on a memory module to present a first high-speed signaling interface to a memory controller, and one or more additional signaling interfaces with respect to one or more memory devices or sets of memory devices. In the case of a buffer IC, cooperative on-die termination may be effected as between buffer ICs (e.g., in respective memory controller interfaces) and/or between two or more memory devices coupled to a buffer IC via a shared high-speed signaling link. The memory controller itself (e.g., element 153 of FIG. 1) may be implemented as a dedicated-function IC or combined with other functions within an application-specific IC (ASIC), and/or with one or more processing cores in a general-purpose or special-purpose processor.

Although a parallel pull-up and pull-down termination scheme is depicted in FIG. 1 and other embodiments described below, the termination within a given integrated-circuit device may alternatively be effected via pull-up only or pull-down only, which selection may be fixed by design, configured during system production or even configured dynamically during system run-time (e.g., by programming appropriate value(s) into one or more configuration registers). Also, while precisely equal termination impedances are depicted in the cooperative on-die termination arrangement shown in FIG. 1 and in embodiments described below, the on-die termination impedances within memory devices enabled to jointly terminate a given signaling link need not be precisely equal and may even be intentionally non-uniform. In one embodiment, for example, non-uniform on-die termination impedances may be applied by two or more memory devices to compensate for differences in the lengths of stubs attaching the memory devices to the signaling link being terminated. Alternatively, the termination impedances to be applied jointly to a signaling link by two or more memory devices (i.e., as part of a cooperative termination) may be tuned to respective, possibly-different values determined during a calibration or other tuning operation to maximize a desired signaling characteristic, such as data eye width and/or height. Accordingly, the term "cooperative" is used broadly herein to encompass both uniform and non-uniform termination contributions from multiple integrated-circuit devices disposed, for example, on the same memory module and/or within the same integrated circuit package.

FIGS. 2A-2E illustrate an exemplary approach to cooperative on-die termination within a memory system having one or more slots (or connectors) for insertion of removable memory modules, where termination control signals are generated at a memory controller 181, utilizing a signal line from the memory controller 181 to the memory devices on the module or on the plurality of modules. Referring to exemplary module-based memory system 180 of FIG. 2A, each of one or more memory modules 185 is assumed to include at least two ranks of memory devices, rank A and rank B, disposed on respective, opposite faces of a module substrate 186. Each memory device 191 on the module (i.e., the memory devices of both ranks) is coupled to memory controller 181 via a common (i.e., shared) set of module control/address (MCA) links which may include, for example and without limitation, address links (Addr), command links (Cmd), and one or more timing related link (e.g., a clock link, Clk, and a clock-enable link, ClkEn). By contrast, the two ranks of memory devices are coupled to respective sets of rank control (RC) links each set of which may include, for example and without limitation, a chip-select link (CSA for the memory devices of rank A, and CSB for the memory devices of rank B) and a termination-control link (TCA for the memory devices of rank A and TCB for the memory devices of rank B). Further, within a given rank, each memory device is coupled to a respective set of bi-directional data links (DQ) and unidirectional data-control links, the latter of which may include, for example and without limitation, one or more data mask links (DM) and one or more data timing links (DQS; e.g., for conveying a strobe signal, clock signal or other timing signal that controls the timing of data link sampling within the data destination). Moreover, each set of data-related links (DQ, DM, DQS) is coupled to a respective memory device within each rank so that, in the depicted two-rank module 185, two memory devices (those disposed directly opposite one another on front and back surfaces of the memory module substrate 186) are coupled in common to each respective set of data-related links.

Each individual signaling link depicted in FIG. 2 may be formed by multiple segments, including without limitation, an on-controller segment extending from termination, reception and/or transmission circuitry within memory controller 181 to an external contact of the memory controller; a controller-to-module segment extending from an external contact of memory controller 181 to a connector contact within at least one of the memory module slots (i.e., Module Slot 1, Module Slot 2, etc.), an on-module segment extending from a connector contact 192 (e.g., disposed at an edge of the memory module to mate to a counterpart contact of the connector) to an external contact of at least one memory device 191 disposed on a memory module inserted within the module slot, and an on-memory segment extending from the external contact of the at least one memory device through package wiring structures (e.g., vias, bond-wires, etc.) to termination, reception and/or transmission circuitry on a memory IC die. The controller-to-module and on-module segments of the signaling link may be formed, for example and without limitation, by conductive traces disposed on surface layers and/or internal layers of printed-circuit board substrates (e.g., substrate 186), vias for intercoupling such traces disposed on different substrate layers, and/or various types of flexible or rigid cables (e.g., polyimide tape having conductive traces formed thereon).

Figure 2A:
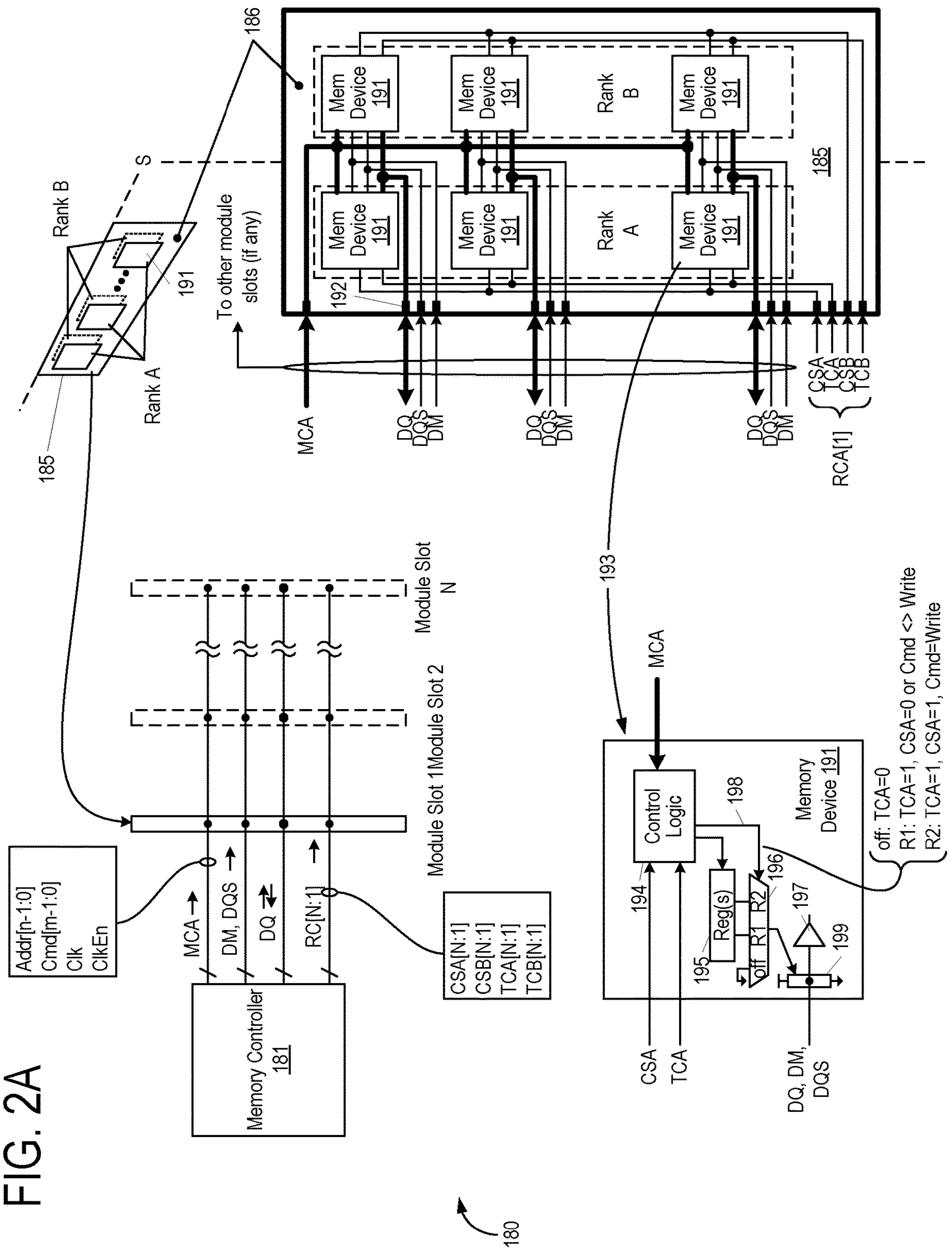
FIGS. 2A-2E illustrate an exemplary approach to cooperative on-die termination within a memory system having one or more slots (or connectors) for insertion of removable memory modules.

Still referring to FIG. 2A, memory system 180 may include only a single module slot (e.g., "Module Slot 1") or may include additional module slots (e.g., "Module Slot 2" . . . "Module Slot N") to permit insertion of one or more additional memory modules. In the latter case (multiple module slots), the module control/address links may be coupled in parallel to the memory devices in all populated module slots, while distinct sets of rank control links may be coupled to respective ranks of memory devices within each of the populated module slots (thus, the overall set of rank control links depicted as CSA, CSB, TCA, TCB for exemplary memory system 180 in which each of the N module slots may be populated with a dual-rank memory module 185). Each set of data-related links may be coupled in parallel to a memory device per rank, so that each individual data-related link is coupled to a number of memory devices (N) equal to the total number of ranks in the memory system.

In exemplary memory system 180, memory read and write operations are carried out with respect to all the devices of a selected rank in parallel. That is, memory controller 181 asserts one of N chip-select signals (i.e., one of CSA, to select the devices of rank A on one of N memory modules, or one of CSB to select the devices of rank B on one of N memory modules) to enable a selected-rank of memory devices 191 to receive a memory access command via the module command/address lines (MCA), and also asserts termination control signals as necessary to establish a desired signaling link termination for the selected rank. In one embodiment, shown in detail view 193, each memory device 191 within a given rank includes a single memory integrated circuit having control logic 194 that responds to incoming termination-control and chip-select signals (TCA and CSA in the example shown as the depicted device is included within memory rank A) by selecting one of three on-die termination states: OFF (i.e., termination disabled, causing high-impedance or open condition and thus no termination), R1 (a first termination impedance) or R2 (a second termination impedance). More specifically, if the incoming termination-control signal for the corresponding transaction was in a logic '0' state (i.e., TCA=0, which may be a high or low signal depending on the active logic state), the OFF state is selected and termination is disabled. By contrast, if the termination-control signal for the corresponding transaction was in a logic '1' state, then termination value R1 is applied during the transaction if the chip-select signal for the corresponding transaction was in a logic low state (CSA=0) or if the incoming command for the corresponding transaction was not a memory write command (CMD=/Write); or termination value R2 is applied during the transaction if the chip-select signal for the corresponding transaction was in a logic high state (CSA=1) and the incoming command for the corresponding transaction was a memory write command (CMD=Write). The on-die termination mode selection is depicted conceptually in FIG. 2A by multiplexer 196 and its output selection in response to multiplexer control signal 198 from control logic 194. Other selection circuits may be used in alternative embodiments. Also, as shown, one or more registers 195 may be provided to store the R1 and R2 termination impedance settings, either of which may be disabled (i.e., such that a high impedance is applied). Depending upon the termination mode selection, the appropriate termination setting signals are applied to termination circuit 199 to establish the specified on-die termination at the input of receiver 197. Though not specifically shown, a transmitter (which may include pull-down, pull-up driver elements that form part or all of the termination circuit 199) may also be coupled to the incoming signaling link (e.g., coupled to bidirectional DQ and DQS links) to enable bidirectional signal transmission.

Figures 2B, 2C:
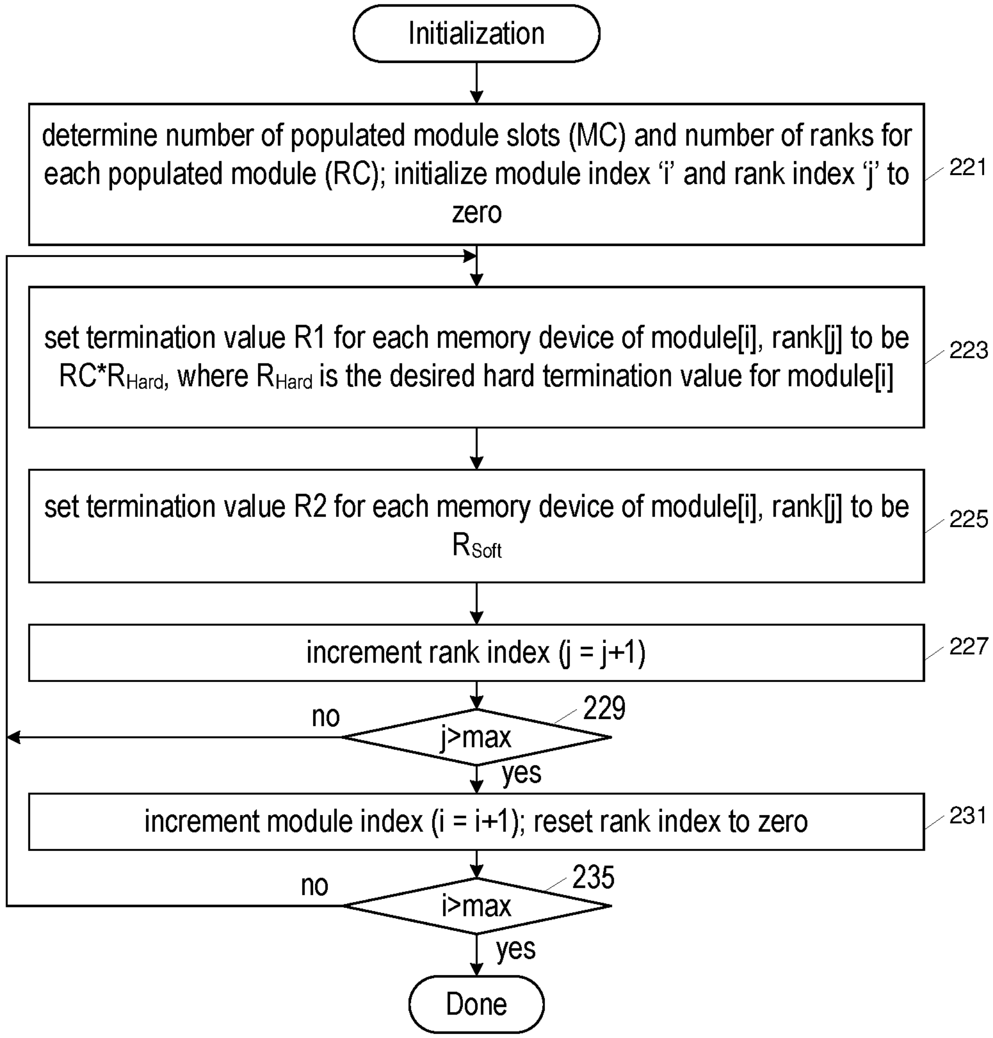

FIG. 2B illustrates an exemplary table 210 of on-die termination settings that may be enabled by the memory controller within the system of FIG. 2A. For purposes of example, the memory system is assumed to be populated with two memory modules (Module 1, Module 2), each of which includes two ranks of memory devices (Rank A, Rank B). As table 210 demonstrates, the memory controller enables different termination settings within the four memory ranks depending on the rank being written to (though not shown, it is assumed that the controller disables on-die termination within all memory ranks during memory read operations). More specifically, in the example shown, it is assumed that a relatively high-impedance on-die termination (i.e., weak termination referred to herein as a "soft" termination) is desired within the memory module containing the rank under write (i.e., the rank selected by assertion a chip-select signal for the transaction), and a relatively low-impedance on-die termination (i.e., strong termination referred to herein as a "hard" termination) is desired within the memory module containing the non-selected ranks (i.e., the "non-selected memory module"). In one embodiment, for example, the soft termination is 120 ohms and the hard termination is 40 ohms or 60 ohms, though any other hard and/or soft termination values may be applied, depending on system characteristics.

In an embodiment that enables selection of the R2 termination impedance only in a rank selected for memory write (i.e., individual memory devices are required to register incoming write command in order to select the R2 termination), the R2 termination value may be programmed to match the desired soft termination value ($R_{Soft}$), while the R1 termination value is programmed to be twice the desired hard termination value (i.e., $^{2}R_{Hard}$, where $R_{Hard}$ is the desired hard termination). By this operation, the desired hard termination may be effected by enabling cooperative on-die termination within each rank of memory devices of the non-selected memory module, while the desired soft termination may be effected by directing a write operation to one of the two ranks of the other memory module. More specifically, as demonstrated by table 210, when writing to Rank A of Module 1, the memory controller asserts the termination control signals to ranks A and B of Module 2, thereby establishing a cooperative, parallel on-die termination of $2R_{Hard}$ in each rank, and thus the desired net termination, $R_{Hard}$, for each signal link. As discussed, because the signal current (or termination current) flowing via a given signaling link to the termination elements within the non-selected memory module is split between the two termination-enabled devices, the signal current flows through a net package inductance that is approximately half the inductance that would apply if on-die termination was enabled in only one of the two ranks of the non-selected memory module. In implementations in which each memory device includes appreciable package inductance (e.g., due to presence of package vias and other signal conduction structures), the level of simultaneous switching output (SSO) noise may be substantially reduced, improving system power integrity and thus signaling margins as a whole.

Still referring to table 210 and continuing with the write to Rank A of Module 1, the termination within Rank B of Module 1 (i.e., the non-selected rank) is disabled (e.g., by deassertion of the termination control signal to that rank) as the write to Rank A of Module 1 will enable termination of desired soft termination, $R_{Soft}$.

When writing to Rank B of Module 1, cooperative on-die termination is enabled within the non-selected memory module (Module 2). As discussed above (i.e., R1 ($2R_{Hard}$) termination enabled in each of the two ranks of the non-selected memory module, thus effecting the desired per-link termination, $R_{Hard}$, but with effectively reduced package inductance). The termination control signals asserted to Ranks A and B of Module 1 are reversed. That is, the termination-control signal to Rank A is deasserted, while the termination-control signal to Rank B is asserted, thus enabling Rank B to apply the desired soft termination, $R_{Soft}$ (R2), in response to registration of the incoming write command.

Continuing with FIG. 2B, termination control during write operations directed to Module 2 Ranks A and B is essentially the same as during the writes to Module 1 Ranks A and B, except that the terminations applied within the two memory modules is reversed. That is, in a write to Module 2, Rank A or Rank B, cooperative on-die termination $2R_{Hard}$ is enabled within both ranks of Module 1 (thus effecting the desired per-link termination ($R_{Hard}$), but with effectively reduced package inductance), while termination, $R_{Soft}$ is enabled only in the rank under write in Module 2 (disabling termination in the non-selected rank of Module 2).

FIG. 2C illustrates an exemplary system initialization operation that may be executed by memory controller 181 of FIG. 2A to establish the termination configuration shown in FIG. 2B, including the cooperative on-die termination within a non-selected memory module during memory write. Initially, at 221, the memory controller determines the number of populated module slots (MC) and the number of memory ranks (RC) for each inserted memory module, and also initializes a module index ('i') and rank index ('j') to zero. Thus, generalizing from the two-module, two-ranks-per-module example of FIG. 2B, the module count may range from one to the number of available module slots in a given system, and the number of ranks included within each memory module may independently vary (i.e., different rank count from one module to the next) and may range from one to any practicable number of memory ranks. Conversely, the module count may be fixed in a given system and/or the number of ranks per module may be fixed so that all or portion of the operation at 221 may be omitted. In any case, the memory controller may receive information regarding the system configuration (e.g., number of modules, number of ranks included within each module) by querying the module slots, by reading a serial-presence detect (SPD) or other on-module non-volatile storage element, by receiving the information from other system components (e.g., a processor executing boot-up code or the like), or from any other source.

Continuing with FIG. 2C, at 223, the memory controller sets the termination value R1 for each memory device of module, rank to be $RC*R_{Hard}$, where '*' denotes multiplication and 'RC' is the rank count for module and thus the number of memory devices in which on-die termination will be simultaneously enabled to terminate a given signaling link coupled to module. At 225, the memory controller sets termination value R2 for each memory device of module, rank to be $R_{Soft}$, the desired on-die termination to be applied by a rank under write. In another embodiment, the memory controller sets termination value R2 for each memory device of module, rank to be $RC*R_{Soft}$. In one embodiment, the memory controller sets the termination values, R1 and R2, within a rank of memory devices by issuing one or more register write commands via the module command/address lines, asserting the chip-select signal for the memory rank being programmed (or multiple chip-select signals if multiple ranks are to be programmed in response to a broadcast instruction). The termination-value settings (i.e., pattern of bits representing the impedance to be applied when on-die termination is enabled) may also be transmitted over the module command/address lines or in part or whole via the data-related signaling links (e.g., DQ and/or DM). In another embodiment, termination-value settings may also be transmitted over a side-band serial interface. In any case, the memory devices selected by asserted chip-select signal(s) responds to the register write command by storing the termination-value setting within the specified register(s), thus effecting a register programming operation.

Still referring to FIG. 2C, the rank index is incremented at 227 and then evaluated at 229 to determine whether termination-value settings for the last rank of a given module has been programmed If the last rank has not yet been programmed, the programming operations at 223 and 225 (i.e., setting termination values R1 and R2) are repeated for the new rank, and then the rank index is incremented and evaluated again at 227 and 229. Upon determining that the last rank for memory module has been programmed (affirmative determination at 229), the module index is incremented at 231 (and rank index reset to zero) and evaluated at 235. If the termination settings for the ranks of the last module have not been programmed (i.e., negative determination at 235), the operations at 223, 225, 227 and 229 are repeated to program the ranks of the next memory module in sequence. Otherwise, if the termination-value settings for the last module have been programmed (affirmative determination at 235), then the initialization of the on-die termination settings within the memory modules is deemed complete.

Still referring to FIG. 2C, it should be noted that single termination settings R1 and R2 may be programmed in a single register-write operation, instead of the two operations shown at 223, 225. Also, termination-value settings within the ranks of a given memory module or even within the ranks of multiple memory modules may be programmed via a shared command or set of commands (e.g., a register-write command that is effectively broadcast to multiple ranks through concurrent assertion of multiple chip-select signals), and thus established in fewer programming operations than in the rank-by-rank, module-by-module example shown. More generally, instead of the initialization procedure shown at FIG. 2C or other initialization embodiments shown and described below, the termination configuration may be preset during device and/or system manufacture.

Figure 2D:
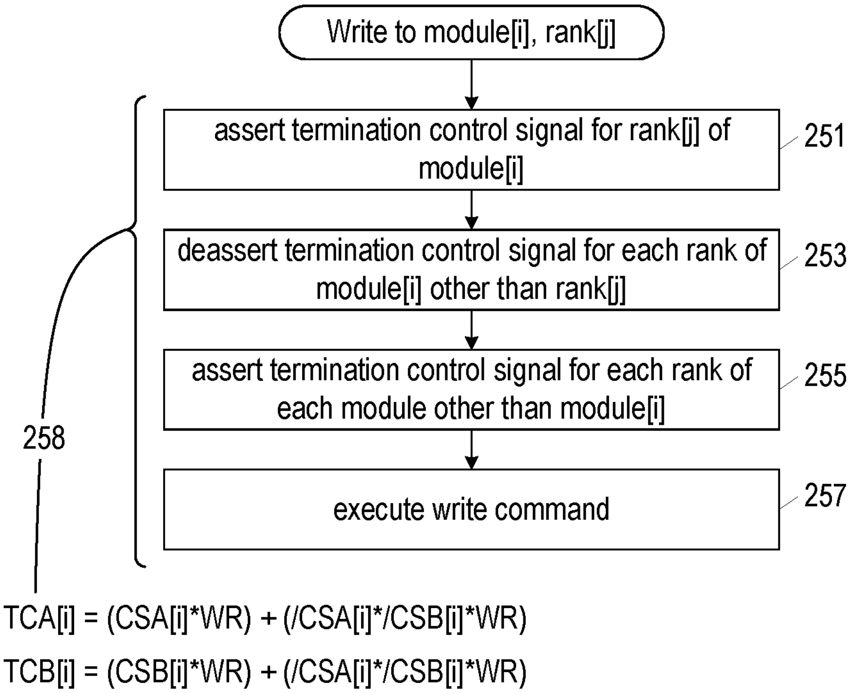
Figure 2E:
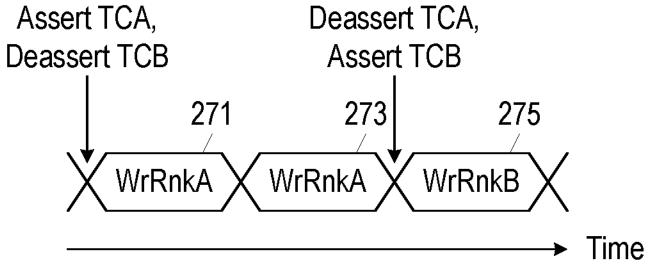

FIG. 2D illustrates an exemplary write operation that may be executed by the memory controller following initialization of the termination settings within the memory devices of the inserted memory modules. At 251, the memory controller asserts the termination control signal for rank of module (i.e., the rank under write) and, at 253, the memory controller deasserts the termination control signal(s) for each rank of module other than rank. At 255, the memory controller asserts the termination control signals for all ranks of each module other than module. By this operation, cooperative multi-device on-die terminations are enabled within all multi-rank memory modules except module. When a write command is issued to rank of module, as shown at 257 (which may be issued concurrently with, before or after assertion/deassertion of the termination control signals), each of the memory devices of rank will respond by applying on-die termination value, $R_{Soft}$, to terminate a respective set of data-related signaling links (e.g., DQ, DM, DQS), thus establishing the termination arrangement shown in FIG. 2B. Other signaling links (e.g., MCA links) may additionally (or alternatively) be terminated by cooperative on-die terminations. In terms of Boolean logic, the termination control signals generated by a memory controller within a system populated by dual-rank modules (i.e., as shown in FIG. 2A) may be expressed as shown at 258, with the understanding that the signals are not typically provided simultaneously for a given transaction, but rather are delivered in a sequence. That is, the memory controller asserts the termination control signal for memory rank A of a given module (i.e., TCA) if (1) the chip-select signal for that rank is asserted in the sequence as part of a write operation (i.e., CSA high and a write operation (WR) is signaled, thus indicating a write to rank A of module), or (2) a write operation is signaled, but the chip-select signals in the sequences for both ranks of the module are low (i.e., a write operation directed to another module as shown by /CSA*/CSB*WR, where '/' denotes logical 'NOT' and '*' denotes logical AND). Similarly, the memory controller asserts the termination control signal for memory rank B of a given module (i.e., TCB) if (1) the chip-select signal in the sequence for that rank is asserted as part of a write operation (i.e., CSB high and a write operation (WR) is signaled), or (2) a write operation is signaled, but the chip-select signals in the sequences for both ranks of the module are low (i.e., /CSA*/CSB*WR). Other logical conditions may be employed to determine the states of the termination control signals in alternative embodiments. Also, in the example shown, if the conditions for asserting a termination control signal for a given rank are not met, the memory controller deasserts the termination control signal.

In one embodiment, the memory controller may reset termination control signals to a deasserted state after each write operation. Alternatively, the memory controller may change the state of the termination control signals only when dictated by the incoming command stream. Thus, in a system populated by multiple two-rank memory modules, the memory controller may assert the TCA control signal and deassert the TCB signal for a given memory module during a memory write to rank A of that memory module, and then leave those termination control signal states unchanged (i.e., maintain the termination control signal states) upon determining that the next memory access operation is also a memory write to rank A of the memory module. (Similarly, even if the rank under write within a given module changes from one write operation to the next, the termination control signals applied to the non-selected modules to establish net on-die termination, $R_{Hard}$, may remain unchanged.) If the ensuing memory access operation is to be a write to the rank B of the same memory module, the memory controller may then swap the states of the TCA and TCB signals (asserting TCB and deasserting TCA) to establish the desired termination. This signal state transition is illustrated in the sequence of write operations indicated at 271, 273 and 275 of FIG. 2E, in part to emphasize a distinction with respect alternative embodiments described below.

Figures 3A, 3B:
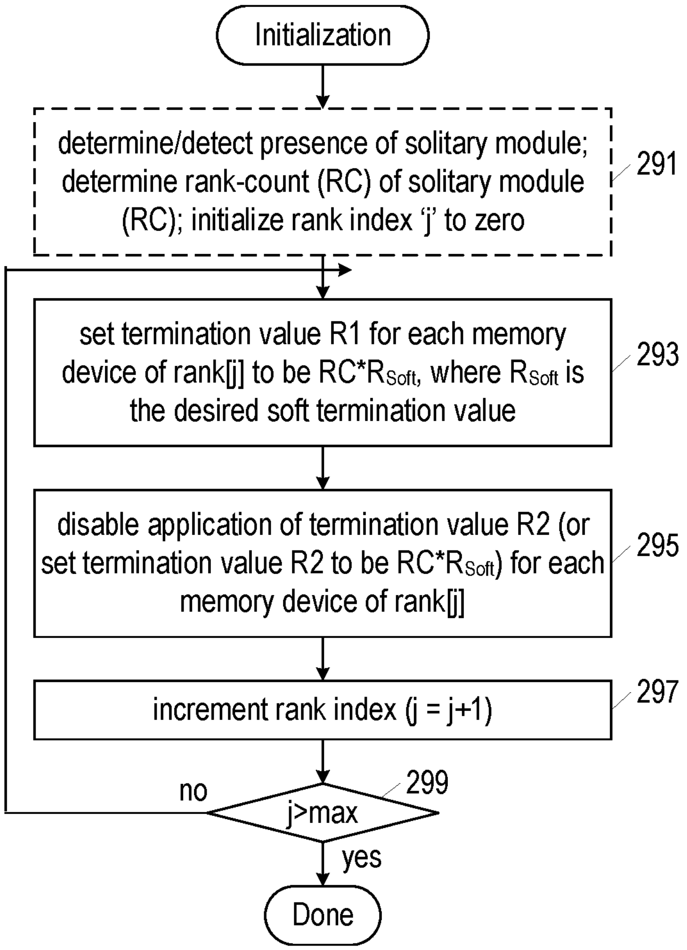
FIGS. 3A-3D illustrate an exemplary approach to cooperative termination within a memory system having a solitary memory module slot populated by a multi-rank memory module.

FIGS. 3A-3D illustrate an exemplary approach to cooperative termination within a memory system having a solitary memory module slot populated by a multi-rank memory module (e.g., memory system 180 of FIG. 2A limited to a single module slot). More specifically, FIG. 3A presents a table (280) of cooperative termination settings that may be selected by a memory controller (e.g., element 181 of FIG. 2A) when writing to a rank of memory devices within a dual rank memory module. Because the system includes only one memory module, one rank or the other of that memory module will be the write data destination (i.e., rank under write) in all write operations. Accordingly, in one embodiment, a soft termination is established within the memory module by programming the R1 termination setting to be $2*R_{Soft}$, where $R_{Soft}$ is the desired termination, and by disabling application of termination value R2 (or by setting R2 to also be $2*R_{Soft}$). (Note that in other examples described herein, including FIGS. 2B, 4B and 7, the "soft" termination value corresponds to setting R2.) By this operation, a cooperative multi-device on-die termination may be established by asserting the termination control signals to both ranks A and B during a write operation such that the signal current flowing via a given signaling link is split between two termination-enabled memory devices in respective ranks and thus flows through a net package inductance that is approximately half the inductance that would apply if the on-die termination was effected in only one of the two ranks of memory devices. In addition to the power integrity benefit discussed above (i.e., SSO noise produced by the data-dependent termination current may be substantially reduced, improving system power integrity and thus signaling margins as a whole), the termination control signals may be maintained without change (and thus avoiding termination switching delay and/or related overhead) as the rank under write is changed from Rank A to Rank B or vice-versa. This is made clear in FIG. 3A by the same-state termination control selection (R1 for both ranks), regardless of the rank under write.

Still referring to FIG. 3A, the soft termination applied in a single-module system may be stronger than the soft termination applied in the multiple-module system described in reference to FIG. 2B. In one embodiment, for example, the soft termination is 40 ohms or 60 ohms (e.g., similar to the hard termination in a multiple-module system) though any other higher or lower soft termination value may be applied.

FIG. 3B illustrates an exemplary system initialization operation that may be executed by a memory controller to establish the cooperative on-die termination configuration shown in FIG. 3A. Initially, at 291, the memory controller determines (or detects) that a solitary module is present, as well as the number of ranks per module (i.e., two ranks were assumed in connection with FIG. 3A for purposes of example only). As in the initialization operation of FIG. 2C, the memory controller may receive information regarding the system configuration (e.g., solitary module and number of ranks therein) by querying the one or more module slots, by reading an SPD memory or other on-module non-volatile storage element, by receiving the information from other system components, or from any other source. Also, the memory controller may assume a given rank count if fixed within the system. For example, if the memory controller is configured to operate with a dual-rank module in the at least one memory module slot, the memory controller may assume the presence of two memory ranks and proceed from that assumption.

Continuing at operation 293 of FIG. 3B, the memory controller sets the termination value R1 for each memory device of rank to be RC*$R_{Soft}$, where '*' denotes multiplication and 'RC' is the rank count and thus the number of memory devices in which on-die termination will be simultaneously enabled to terminate a given signaling link coupled to the module. At 295, the memory controller disables application of termination value R2 (or sets termination value R2 for each memory device of rank to be RC*$R_{Soft}$, thus matching the R1 termination value). The memory controller may set the termination value R1 or R2 (including disabling application of termination value R2) within each rank of memory devices by carrying out register programming operations generally as described above in reference to FIG. 2C.

Still referring to FIG. 3B, the rank index is incremented at 297, and then evaluated at 299 to determine whether the last rank has been programmed If not, the programming operations at 297 and 299 are repeated for the new rank (i.e., indicated by the incremented rank index), and then the rank index is incremented and evaluated again at 297 and 299. Upon determining that all ranks have been programmed (affirmative determination at 299), initialization of the on-die termination settings is deemed complete. As discussed in reference to FIG. 2B, the on-die termination settings may be programmed within two or more (or all) of the memory ranks simultaneously, by asserting chip-select signals for multiple (or all ranks) to enable the termination programming commands to be, in effect, broadcast to all devices coupled to the asserted chip-select signals.

Figure 3C:
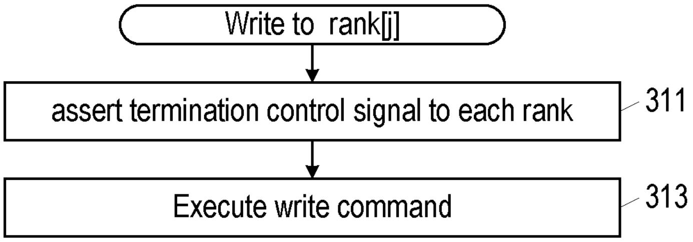

FIG. 3C illustrates an exemplary write operation that may be executed by the memory controller following initialization of the termination settings. As shown, the memory controller asserts the termination control signal for rank of the lone installed memory module at 311, thus establishing the termination arrangement shown in FIG. 3A. Accordingly, when a write command is issued to a given rank of memory devices as shown at 313 (which command may be issued concurrently with, before or after assertion of the termination control signals), the signaling current used to convey data, data mask and/or data timing signals, at least (and possibly other signals such as those conveyed on MCA links), will be split among the memory devices of respective memory ranks. That is, each signaling link will be terminated by the same effective termination ($R_{Soft}$ in this example), but with the net SSO noise reduced according to the number of ranks of memory devices participating in the cooperative on-die termination (i.e., reduced by a factor of approximately 1/RC).

Figure 3D:
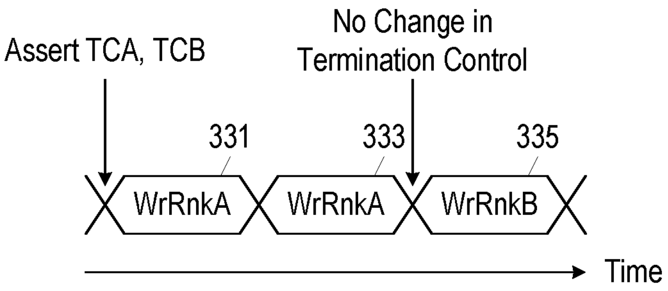

FIG. 3D illustrates an exemplary sequence of back-to-back write operations 331, 333, 335 within the single module system described in reference to FIGS. 3A-3C, emphasizing that termination control signals need not be altered when switching the write data destination from one memory rank to the other. As discussed, this may reduce overall system latency in back-to-back write operations directed to different ranks of the memory module as no termination control signal settings need be changed.

Returning briefly to FIG. 3A, it can be seen that both ranks of memory devices apply the same termination value, regardless of which rank is under write. More generally, in a module having RC ranks, all ranks may enable and disable on-die terminations and apply the same on-die terminations in lock step. Accordingly, in one embodiment, a multi-rank memory module has a solitary termination control input that is coupled in common to the termination control inputs of all the memory devices of the memory module (in contrast to the multiple termination control inputs coupled to the memory devices of respective ranks in the exemplary memory module 185 of FIG. 2A). Moreover, in the larger system, only one termination control link need be routed to the memory module (or memory module slot) and only one termination control output need be provided within the memory controller IC to control termination settings on the memory module.

Figure 4A:
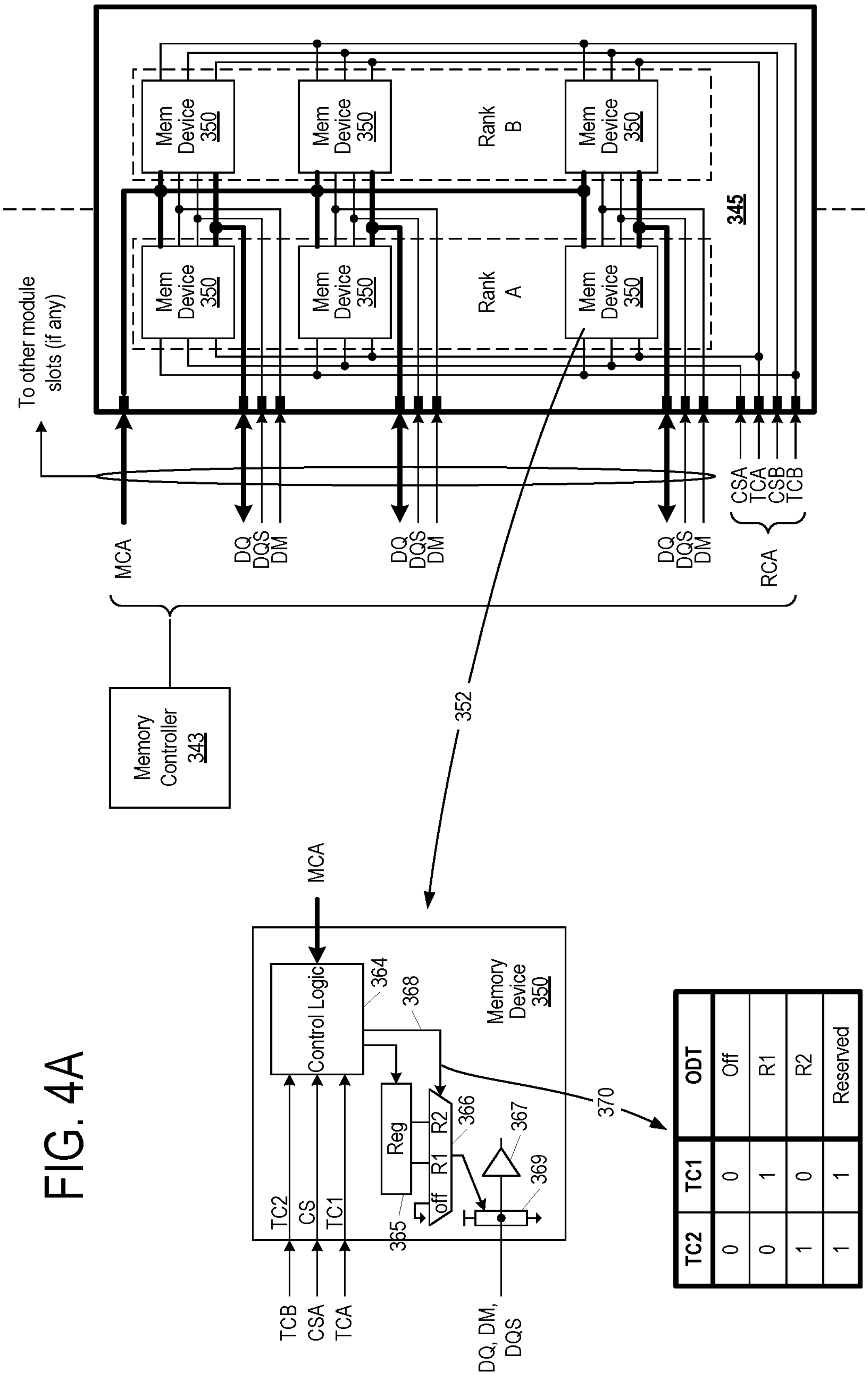
FIG. 4A illustrates an embodiment of a multi-rank memory module capable of applying cooperative on-die termination during a memory write operation regardless of whether the module contains the rank of memory devices being written.

FIG. 4A illustrates an embodiment of a multi-rank memory module 345 capable of applying cooperative on-die termination during a memory write operation regardless of whether the module contains the rank under write and thus regardless of the number of memory modules in the system (i.e., in contrast to the exemplary termination configuration shown in FIG. 2B in which cooperative on-die termination is applied only within non-selected memory modules). As shown, the memory module may be coupled to a memory controller 343 via exactly the same set of signaling links (MCA, DQ, DQS, DM and RCA) as between memory module 185 and memory controller 181 of FIG. 2A and thus may be entirely pin-compatible with that memory module. Moreover, the incoming signal links may be routed to individual memory devices 350 in essentially the same manner as shown in FIG. 2A, except that each of the two termination control links, TCA, TCB, are coupled to each memory device in each memory rank (instead of to memory devices in respective ranks). Accordingly, as shown in detail view 352, each memory device 350 includes two termination control inputs, TC1 and TC2, coupled respectively to receive the TCA and TCB termination control signals and control logic 364 that selects one of at least three on-die termination settings, OFF, R1 and R2, according to which of the four possible termination control states is signaled by the termination control signals (one of the four states being reserved, for example, for a fourth on-die termination setting). More specifically, the control logic disables on-die termination (i.e., de-coupling the on-die termination circuit 369 from the signal link and thus presenting a high-impedance state to the signal link) if the termination control signals at both inputs are low (i.e., TC1=TC2=0), and otherwise enables either termination values R1 or R2 to be applied as the on-die termination circuit 369 according to which of the two termination control signals is raised. As mentioned, the termination setting to be applied if both termination control signals are high (i.e., TC1=TC2=1') is reserved, for example, for a third termination resistance (which itself may be dynamically triggered, for example, by assertion of a chip-select signal at input CS and/or registration of one or more particular commands in the sequences for the corresponding transactions taking into account core access latencies and the like). Moreover, one or more additional termination control signals may be provided to each memory device (and provided to and routed on board the memory module 345) to permit selection of yet other termination settings.

The on-die termination mode selection is depicted conceptually in FIG. 4A by multiplexer 366 and its output selection in response to multiplexer control signal 368 from control logic 364. Other selection circuits may be used in alternative embodiments. Also, as shown, one or more registers 365 may be provided to store the R1 and R2 termination impedance settings, either of which may be disabled (i.e., such that a high impedance is applied). Depending upon the termination mode selection, the appropriate termination setting signals are applied to termination circuit 369 to establish the specified on-die termination at the input of receiver 367. Though not specifically shown, a transmitter (which may include pull-down, pull-up driver elements that form part or all of the termination circuit 199) may also be coupled to the incoming signaling link (e.g., coupled to bidirectional DQ and DQS links) to enable bidirectional signal transmission.

Figures 4B, 4C:
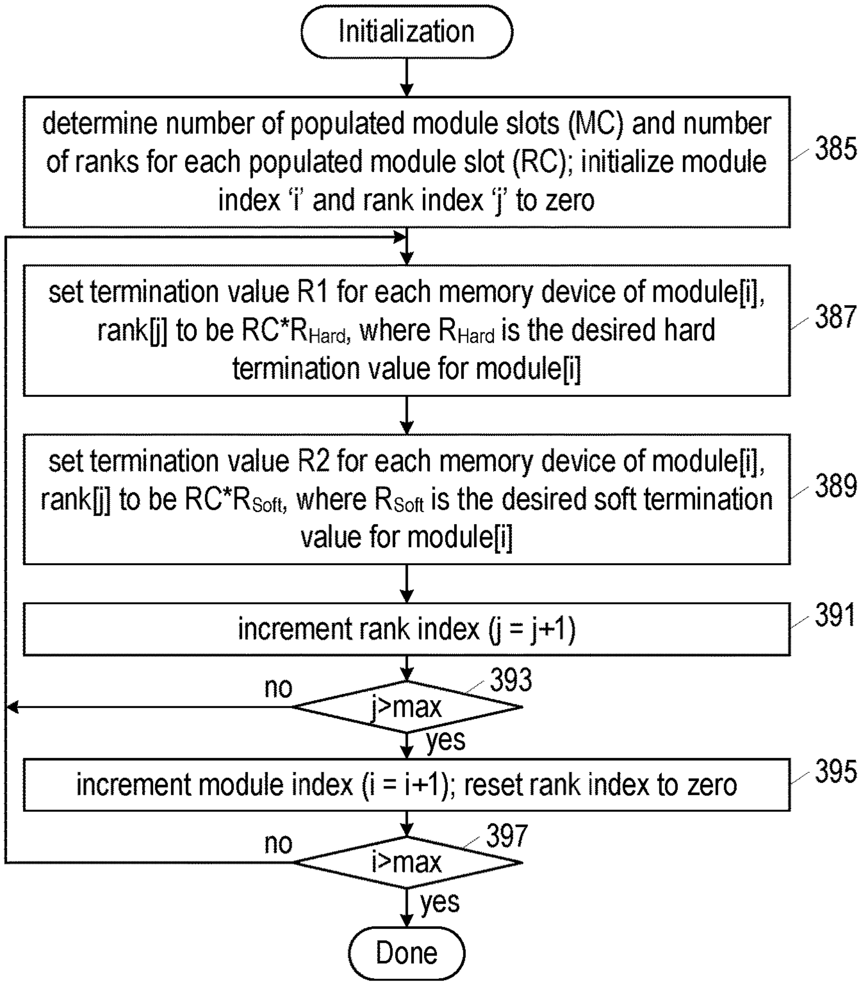
FIG. 4B illustrates an exemplary set of on-die terminations that may be enabled within the dual-rank memory module of FIG. 4A.
FIG. 4C illustrates an exemplary system initialization operation that may be executed by a memory controller to establish the module-cooperative termination configuration shown in FIG. 4B.

FIG. 4B illustrates an exemplary set of on-die terminations that may be enabled within the dual-rank memory module 345 of FIG. 4A by memory controller 343. As shown, the memory controller enables different termination settings within the four memory ranks, depending on the rank being written to (though not shown, it is assumed that the memory controller disables on-die termination within all memory ranks during memory read operations). More specifically, in the example shown, it is assumed that a soft termination is desired within the memory module containing the rank under write, and a hard termination is desired within the non-selected memory module. Further, in contrast to the embodiment of FIG. 2B in which cooperative on-die termination is applied only in the non-selected memory module, cooperative on-die terminations are applied in all memory modules, including the memory module containing the rank under write. This operation is made possible, at least in part, by the provision of multi-bit, chip-select-independent, multi-bit termination control within each of the memory devices as detailed in reference to FIG. 4A. That is, because at least three different on-die termination states (OFF, R1, R2) may be established even within memory devices not selected by assertion of a chip-select signal (i.e., within non-selected ranks), it becomes possible for the memory controller to specify either hard or soft on-die termination states (in addition to disabling on-die termination altogether) in all ranks of memory devices, thereby permitting soft on-die termination to be cooperative (or distributed or shared) between or among multiple ranks (or all ranks) within the module containing the rank under write. Referring specifically to the table of FIG. 4B, during a write to Rank A of Module 1, the memory controller establishes soft, cooperative on-die termination $R_{Soft}$ within the memory module containing the rank under write by enabling the R2 on-die termination state within each rank of Module 1. Because there are two ranks in this example, the R2 termination value within each rank has been programmed to $2R_{Soft}$, thereby yielding a net termination impedance of $R_{Soft}$ with respect to a given signaling link when both on-die terminations (i.e., within the memory devices of Rank A and the memory devices of Rank B) are enabled. As in the embodiment of FIG. 2B, the memory controller establishes hard, cooperative on-die termination within each of the non-selected memory modules by enabling the R1 on-die termination state within each rank of each non-selected module (Module 2 in this first example). Again, because there are two ranks in this example, the R1 termination value within each rank has been programmed to $2R_{Hard}$, thereby yielding a net termination of $R_{Hard}$ with respect to a given signaling link when both on-die terminations are enabled.

In one embodiment, the net soft termination, $R_{Soft}$, may be, for example, 120 ohms and thus in a two-rank memory module, a memory device from each rank may be enabled to switchably couple a 240-ohm termination load to a given signaling link to establish the desired soft termination. In such an embodiment, the net hard termination, $R_{Hard}$, may be, for example, 40 ohms or 60 ohms, and thus in a two-rank memory module, a memory device from each rank may be enabled to switchably couple an 80-ohm or 120-ohm termination load to a given signaling link to establish the desired hard termination. The foregoing impedance values are provided for example only, and may vary in alternative embodiments and in accordance with system characteristics.

Continuing with FIG. 4B, it can be seen that the termination configuration remains unchanged when the rank under write (or write target) changes from Rank A of a given memory module to Rank B of that same module. When the rank under write changes from Module 1 to Module 2, the soft and hard cooperative on-die terminations are switched between the two modules, but are otherwise effected in the manner described above (i.e., soft terminations of $2R_{Soft}$ enabled within each rank of Module 2 and hard terminations of $2R_{Hard}$ enabled within each rank of Module 1).

FIG. 4C illustrates an exemplary system initialization operation that may be executed by a memory controller to establish the module-cooperative termination configuration shown in FIG. 4B. Initially, at 385, the memory controller determines the number of populated module slots (MC) and the number of memory ranks (RC) for each inserted memory module, and also initializes a module index ('i') and rank index ('j') to zero. Thus, generalizing from the two-module, two-ranks-per-module example of FIG. 4B, the module count may range from one to the number of available module slots in a given system, and the number of ranks included within each memory module may independently vary (i.e., different rank count from one module to the next) and may range from one to any practicable number of memory ranks. Conversely, the module count may be fixed in a given system and/or the number of ranks per module may be fixed so that all or portion of the operation at 385 may be omitted. In any case, the memory controller may receive information regarding the system configuration (e.g., number of modules, number of ranks included within each module), by querying the module slots, by reading a serial-presence detect (SPD) or other on-module storage element, by receiving the information from other system components (e.g., a processor executing boot-up code or the like), or by obtaining such information in any other way.

Continuing with FIG. 4C, at 387, the memory controller sets the termination value R1 for each memory device of module, rank to be $RC*R_{Hard}$ and at 389 the memory controller sets the termination value R2 for each memory device of module, rank to be $RC*R_{Soft}$, where '*' denotes multiplication and 'RC' is the rank count for module and thus the number of memory devices in which on-die termination will be simultaneously enabled to terminate a given signal link coupled to the module. As discussed, the memory controller may set the termination values, R1 and R2, within a rank of memory devices by issuing one or more register-write commands via the module command/address lines, asserting the chip-select signal for the memory rank being programmed (or multiple chip-select signals if multiple ranks are to be programmed in response to a broadcast instruction). The termination value setting (i.e., pattern of bits representing the impedance to be applied when on-die termination is enabled) may also be transmitted over the module command/address lines or in part or whole via the data links (e.g., DQ and/or DM). In any case, the memory devices selected by asserted chip-select signal(s) responds to the register-write command by storing the termination-value setting within the specified register(s), thus effecting a register programming operation.

Still referring to FIG. 4C, the rank index is incremented at 391, and then evaluated at 393 to determine whether the last rank of a given module has been programmed If the last rank has not yet been programmed, the programming operations (i.e., setting termination values R1 and R2) are repeated for the new rank, and then the rank index is incremented and evaluated at again at 391 and 393. Upon determining that the last rank for memory module has been programmed (affirmative determination at 393), the module index is incremented at 395 (and rank index reset to zero) and evaluated at 397. If the termination settings for the ranks of the last module have not been programmed, the operations at 387, 389, 391 and 393 are repeated to program the ranks of the next memory module in sequence. Otherwise, if the last module has been programmed (affirmative determination at 397), then the initialization of the on-die termination settings within the memory modules is deemed complete.

As discussed in connection with FIG. 2C, the termination settings R1 and R2 may be programmed in a single register-write operation, instead of the two operations shown (387 and 389). Also, termination settings within the ranks of a given memory module or even within the ranks of multiple memory modules may be programmed simultaneously via a shared command or set of commands (e.g., a register-write command that is effectively broadcast to multiple ranks through concurrent assertion of multiple chip-select signals), and thus established in fewer programming operations than in the rank-by-rank, module-by-module example shown.

Figure 4D:
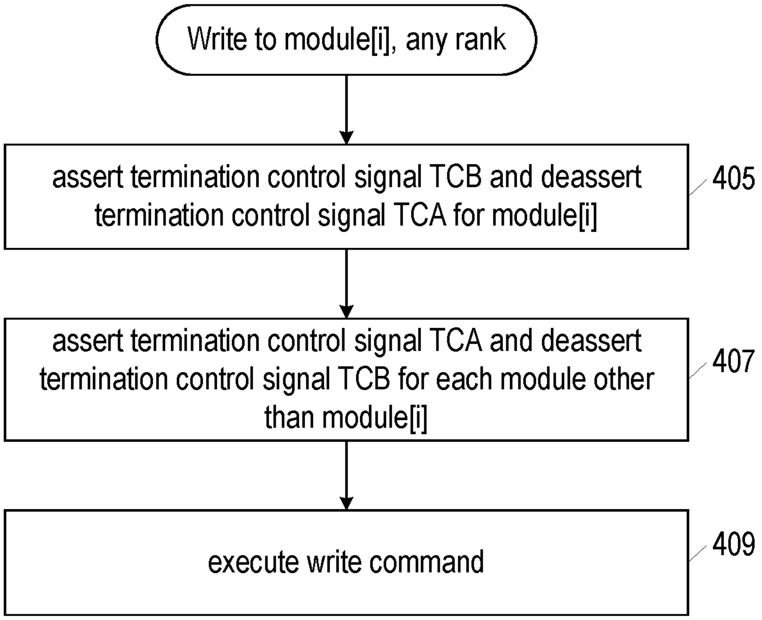
FIG. 4D illustrates an exemplary write operation that may be executed by the memory controller shown in FIG. 4A following initialization of the termination settings within the memory devices of the inserted memory modules.

FIG. 4D illustrates an exemplary write operation that may be executed by the memory controller shown in FIG. 4A following initialization of the termination settings within the memory devices of the inserted memory modules. At 405, the memory controller asserts termination control signal TCB and deasserts termination control signal TCA for module (i.e., the memory module containing the rank under write), and at 407, the memory controller asserts termination control signal TCA and deasserts termination control signal TCB for each module other than module (i.e., each non-selected memory module). By this operation, cooperative multi-device on-die terminations are enabled within all memory modules, with a net on-die termination impedance of $R_{Soft}$ applied within the module containing the rank under write, and a net on-die termination impedance of $R_{Hard}$ applied within each non-selected module. Accordingly, when a write command is executed as shown at 409, the data-related links are terminated by a soft termination impedance in the module containing the rank under write, and by a hard termination impedance in each of the other modules. Other signaling links (e.g., MCA links) may additionally (or alternatively) be terminated by cooperative on-die terminations. Also, while a sequence of operations (405, 407, 409) is shown in FIG. 4D, each of the operations may be carried out concurrently (i.e., at least partly overlapping in time) or in any order. For example, the states of the TCA and TCB signals for each memory module may be established simultaneously by the memory controller. Also, the memory controller may output the memory write command before, simultaneously with, or after setting the states of the termination control signals.

Figure 4E:
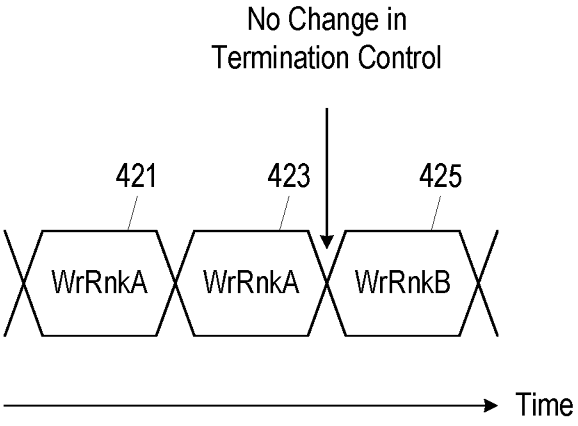
FIG. 4E illustrates a sequence of write operations within a memory system in accordance with FIGS. 4A-4D.

As discussed above, the memory controller may either reset termination control signals to a deasserted state after each write operation or change the state of the termination control signals only when dictated by the incoming command stream. Thus, in a system populated by multiple two-rank memory modules, the memory controller may establish a termination configuration in accordance with FIG. 4B (i.e., by setting termination states of signals TCA, TCB) during a write to a rank of a given memory module, and then leave those termination settings unchanged upon determining that the next memory access operation is directed to a rank within the same memory module (i.e., whether the same or a different rank on that memory module). If, following a write to rank A of a given module, for example, the ensuing memory access operation is to be a write to the rank B of the same memory module, the memory controller may maintain the states of the termination control signals as shown by the sequence of back-to-back write operations 421, 423, 425 (writing to rank A, rank A and then rank B of a given module) in FIG. 4E, thereby avoiding overhead (e.g., latency) that may otherwise be incurred to establish a revised on-die termination configuration.

Figure 5:
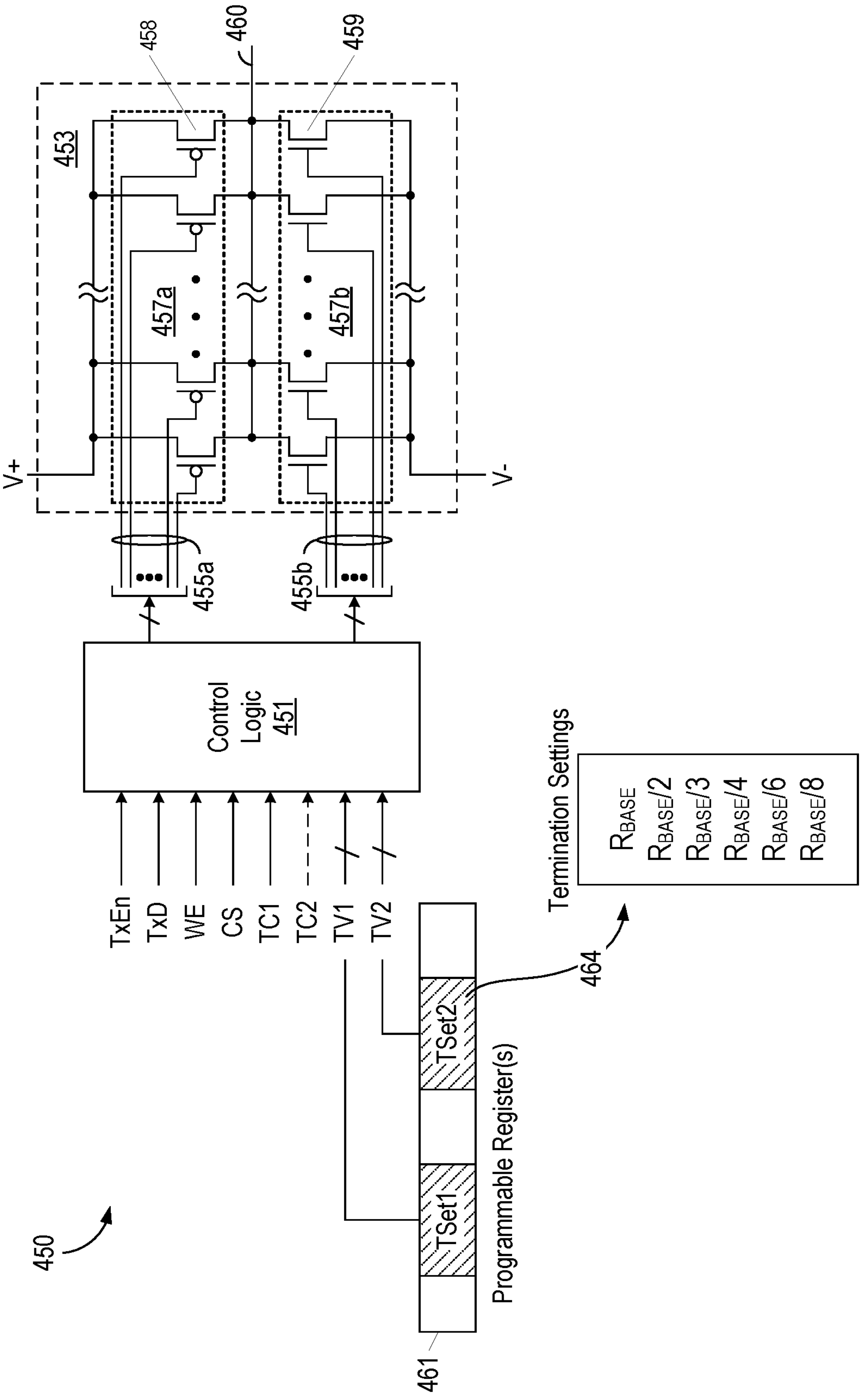
FIG. 5 illustrates an embodiment of a termination/driver circuit that may be used to implement on-die termination circuits described in reference to FIGS. 2A and 4A.

FIG. 5 illustrates an embodiment of a termination/driver circuit 450 that may be used to implement on-die termination circuits described above (e.g., termination circuit 199 of FIG. 2A and/or termination circuit 369 of FIG. 4A). As shown, termination/driver circuit 450 includes control logic 451 and link-loading circuit 453 that may serve alternatively as an on-die termination circuit during signal reception and as a signal output driver during signal transmission. The control logic 451 may be included within the control logic elements depicted in FIGS. 2A and 4A (i.e., elements 194 and 364) and in the embodiment depicted receives a transmit-enable signal, TxEn, transmit-data signal, TxD, write-enable signal, WE, chip-select signal, CS, one or more termination control signals, TC1 (and optionally TC2), and termination-value settings, TV1 and TV2. If coupled to a receive-only (unidirectional) signaling link, the transmit-enable and transmit-data signals need not be provided to the control logic (in which case the circuit 450 may serve exclusively as an on-die termination circuit). Also, if termination/driver circuit 450 is to apply a termination load without regard to the state of the chip-select signal or write-enable signal (e.g., and instead based exclusively on the termination control signals), the chip-select and write-enable signals also need not be provided to control logic 451.

Termination/driver circuit 450 performs the role of a push-pull output driver when the transmit-enable signal, TxEn, is asserted, and switches to an on-die termination function when the transmit-enable signal is deasserted. More specifically, when the transmit-enable signal is asserted, the control circuit selectively enables switching elements within pull-up and pull-down switch banks (457*a* and 457*b*) in accordance with the transmit data state (TxD) to establish a desired output signal representative of the transmit data (sourcing or sinking current and thus enabling a signaling current to flow via link input/output (I/O) node 460). When the transmit-enable signal is deasserted, the control circuit selectively enables switching elements within the same pull-up and pull-down switch banks in accordance with the termination control signal(s), termination-value signals and, optionally, the state of the chip-select and write-enable signals, to switchably couple a desired on-die termination load to link I/O node 460.

In the particular embodiment shown, switch bank 457*a* is implemented by a set of P-MOS (P-type metal-oxide-semiconductor) transistors 458 coupled in parallel between link I/O node 460 and the upper supply voltage, V+ (e.g., $V_{DD}$ or $V_{DDIO}$), while switch bank 457*b* is implemented by a counterpart set of N-MOS (N-type MOS) transistors 459 coupled in parallel between link I/O node 460 and a lower supply voltage, V− (e.g., Ground or $V_{SS}$ or $V_{SSIO}$). The gates of the P-MOS transistors and N-MOS transistors are controlled by respective enable signals asserted and deasserted on enable-signal lines 455*a*, 455*b* by control logic 451, thus enabling a desired combination of N-MOS and/or P-MOS transistors to be switched to a conducting state (or partially conducting state) and thus establish a desired transmit and/or termination state within the transmit/termination circuit. More specifically, the number of P-MOS transistors switched to a conducting state controls the effective load between the upper supply voltage, V+, and link I/O node 460, so that, if a current-sourcing transmit state is required (e.g., TxEn=1, TxD=1), a predetermined number the P-MOS transistors within switch bank 457*a* may be switched to a conducting state to effect a low or negligible impedance between the upper signaling supply voltage node and the signal I/O node, while all N-MOS transistors within switch bank 457*b* are concurrently switched to a non-conducting state to decouple the lower signaling supply voltage node from the signal I/O node. Conversely, if a current-sinking transmit state is required (e.g., TxEn=1, TxD=0), a predetermined number of the N-MOS transistors may be switched to a conducting state and all the P-MOS transistors may be switched to a non-conducting state. The precise number of N-MOS and P-MOS transistors switched on to establish a given output signal may be fixed, or may be calibrated during system production or system run-time. In the case of calibration, on-chip programmable register(s) 461 (e.g., corresponding to register 195 of FIG. 2A or register 365 of FIG. 4A) may include fields to store values that control which and/or how many of the transistors within a given switch bank 457*a*, 457*b* are to be enabled during data transmission, thus permitting signal drive strength to be adjusted in run-time calibration operations.

If a non-transmitting mode is signaled (e.g., TxEn=0), but other incoming control signals (TC1, TC2, CS and/or WE) indicate that on-die termination is to be enabled, control logic 451 transitions to a termination mode by switching a subset of the NMOS transistors 459 within switch bank 457*b* and a subset of the P-MOS transistors 458 within switch bank 457*a* to a conducting state (or to a partially conducting state) to establish a desired on-die termination impedance. In one embodiment, the subsets of N-MOS transistors and P-MOS transistors switched on during the termination mode is controlled by one of the termination-value settings, TV1 and TV2, provided to the control logic 451 and thus by one of the two termination settings (TSet1, TSet2) programmed within register(s) 461. In an embodiment according to FIG. 2A, for example, termination-value setting TV1 is used to selectively switch on transistors within switch banks 457*a*/457*b* if the termination control signal TC1 (TC2 may be omitted) is asserted and either the chip-select signal (CS) or the write-enable signal (WE) is deasserted (i.e., termination control signal asserted, but no write operation directed to the memory device). In such an embodiment, termination-value setting TV2 may be used to selectively switch on transistors within switch banks 457*a*/457*b* if the termination control signal, chip-select signal and write-enable signal are all asserted (and if the alternate-termination-under write is enabled within the mode register(s)), thereby enabling an alternate on-die termination value to be applied when a write operation is directed to the memory device. If the termination control signal is deasserted, then on-die termination mode may be disabled (e.g., the OFF state discussed above) as, for example, during memory read operations.

In a memory device embodiment according to FIG. 4A, termination-value settings TV1 and TV2 may alternately be selected to control the on-die termination value (i.e., selectively switch on respective combinations of transistors within switch banks 457*a*/457*b*) according to the states of termination control signals TC1 and TC2. For example, if TC1 is high and TC2 low, TV1 may be selected to control the on-die termination, and if the states are reversed (TC2 high, TC1 low), TV2 may be selected to control the on-die termination. If neither of the termination control signals is high, on-die termination may be disabled.

In one embodiment, the termination settings, TC1 and TC2 (i.e., corresponding to termination-value settings TV1 and TV2), may be programmed to be any of a base termination and scaled versions of the base termination as shown at 464 (e.g., base termination $R_{BASE}$ and scaled terminations $R_{BASE/2}$, $R_{BASE/3}$, $R_{BASE/4}$, $R_{BASE/6}$, $R_{BASE/8}$, etc.). As an example, the base termination may be established by turning on a single P-MOS transistor within switch bank 457*a* and a single N-MOS transistor within switch bank 457*b*, with each scaled version of the base termination established by turning on a scaled number of P-MOS and N-MOS transistors (at least in terms of the effective transistor width effected by the multiple switched-on transistors). Thus, $R_{BASE/2}$ may be effected by switching on two transistors in each of banks 457*a* and 457*b*, $R_{BASE/3}$ may be effected by switching on three transistors in each of banks 457*a* and 457*b*, and so forth. Additionally, any or all of the available terminations may be calibrated, for example, by reference to an internal and/or external resistive element (e.g., a precision resistor), in which case, incremental adjustments may be achieved through the precise number of transistors enabled (e.g., a given transistor shown within switch bank 457*a* or 457*b* may be implemented by multiple parallel transistors controlled in part by a common one of enable-signal lines 455*a*/455*b* and in part by respective calibration bits, in effect enabling the number of engage-able parallel transistors to be modulated by the calibration bits).

Still referring to FIG. 5, more or fewer termination settings than shown at 464 may be applied in alternative embodiments, with different or additional factors applied to determine the strength of the termination. Also, either or both of the termination settings TSet1 and TSet2 may be restricted to a subset of the complete set of termination settings. The precise termination value to be applied under a given state of the signaling system may be established by selection of one of a fixed number of permissible enable-signal combinations, or through production-time or run-time testing (calibration). For example, one of a fixed number of termination settings may be determined during production-time or run-time (or pre-selected) and programmed within one or more other fields of registers 461 by a control device such as a programmed-processor. Alternatively, a signal quality metric may be evaluated for different termination settings to enable identification and selection of termination setting(s) that yield a maximized (or near-maximized) value of the metric. Further, though the individual transistors (or other switching elements) within either one of switch banks 457*a* or 457*b* are depicted as being identical, the transistors controlled by respective enable-signal lines 455*a*, 455*b* may be differently sized (e.g., having differently-sized footprints and/or formed by different numbers of ganged transistors having commonly coupled gates) to establish a set of weighted switching transistors. For example a set of N binary-weighted switching transistors (the smallest having unit size 'x', followed by transistors having sizes 2.times., 4.times., 8.times., . . . , 2.sup.N−1.times.) may be provided and controlled by respective enable-signals to enable selection of 2.sup.N−1 different impedance settings.

Figure 6:
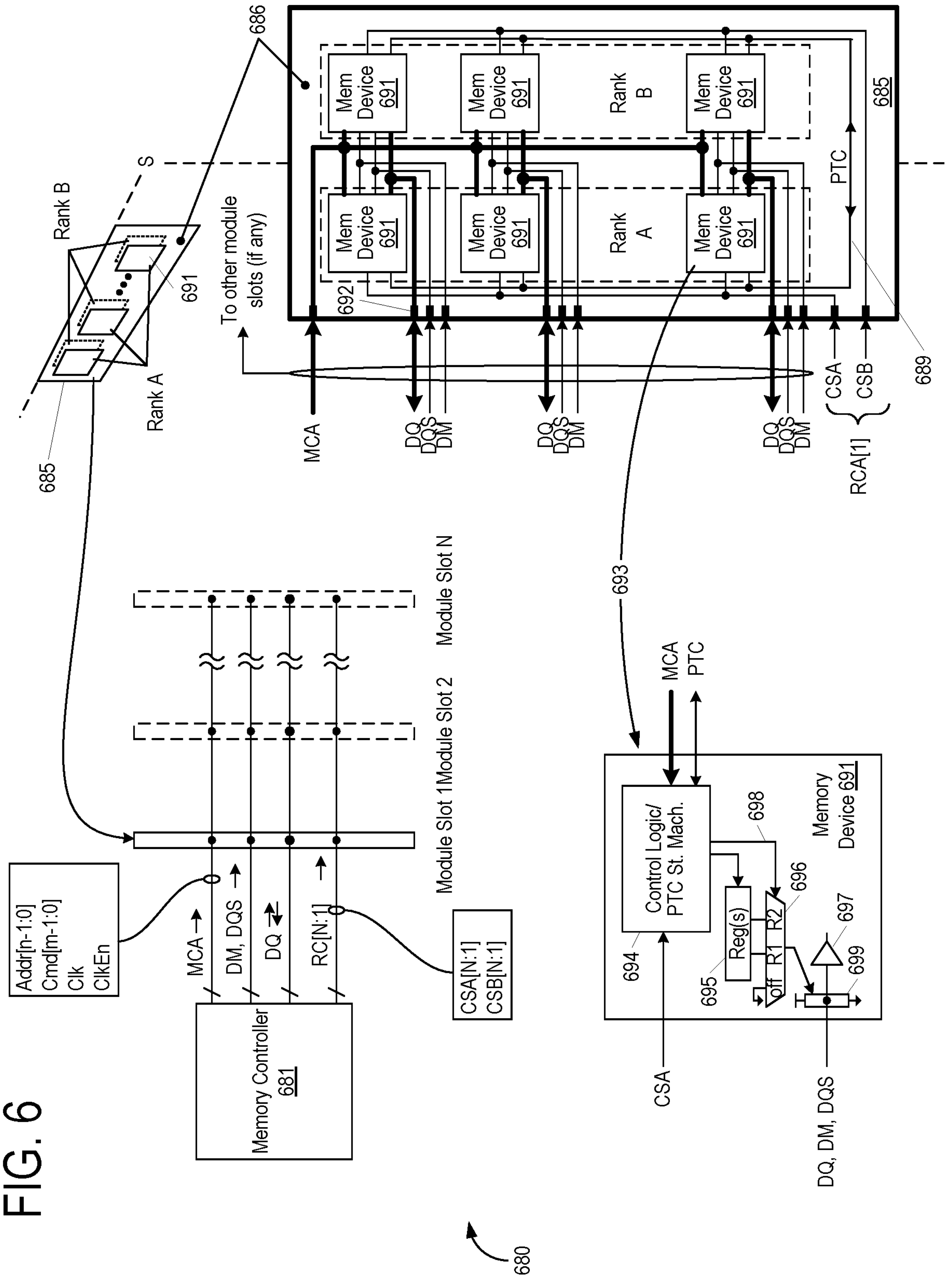
FIG. 6 illustrates an embodiment of a memory system having one or more slots (or connectors) for insertion of removable memory modules of a multi-rank memory module configured for applying cooperative on-die termination during a memory write operation with termination control signals being produced on the memory modules.

FIG. 6 illustrates an exemplary approach to cooperative on-die termination within a memory system having one or more slots (or connectors) for insertion of removable memory modules with distributed termination control. Referring to exemplary module-based memory system 680 of FIG. 6, each of one or more memory modules 685 is assumed to include at least two ranks of memory devices, rank A and rank B, disposed on respective, opposite faces of a module substrate 686. Each memory device 691 on the module (i.e., the memory devices of both ranks) is coupled to memory controller 681 via a common (i.e., shared) set of module control/address (MCA) links which may include, for example and without limitation, address links (Addr), command links (Cmd), and one or more timing related link (e.g., a clock link, Clk, and a clock-enable link, ClkEn). By contrast, the two ranks of memory devices are coupled to respective sets of rank control (RC) links each set of which may include, for example and without limitation, a chip-select link (CSA for the memory devices of rank A, and CSB for the memory devices of rank B). Unlike the embodiment of FIG. 2A, the rank control links in the system of FIG. 6 do not include a termination-control link coupled to the memory controller 681. Termination control is distributed to the memory devices 691 as explained in more detail below.

Further, within a given rank, each memory device is coupled to a respective set of bi-directional data links (DQ) and typically unidirectional data-control links, the latter of which may include, for example and without limitation, one or more data mask links (DM) and one or more data timing links (DQS; e.g., for conveying a strobe signal, clock signal or other timing signal that controls the timing of data link sampling within the data destination). Moreover, each set of data-related links (DQ, DM, DQS) is coupled to a respective memory device within each rank so that, in the depicted two-rank module 685, two memory devices (those disposed directly opposite one another on front and back surfaces of the memory module substrate 686) are coupled in common to each respective set of data-related links.

Each individual signaling link depicted in FIG. 6 may be formed by multiple segments, including without limitation, an on-controller segment extending from termination, reception and/or transmission circuitry within memory controller 681 to an external contact of the memory controller; a controller-to-module segment extending from an external contact of memory controller 681 to a connector contact within at least one of the memory module slots (i.e., Module Slot 1, Module Slot 2, etc.), an on-module segment extending from a connector contact 692 (e.g., disposed at an edge of the memory module to mate to a counterpart contact of the connector) to an external contact of at least one memory device 691 disposed on a memory module inserted within the module slot, and an on-memory segment extending from the external contact of the at least one memory device through package wiring structures (e.g., vias, bond-wires, etc.) to termination, reception and/or transmission circuitry on a memory IC die. The controller-to-module and on-module segments of the signaling link may be formed, for example and without limitation, by conductive traces disposed on surface layers and/or internal layers of printed-circuit board substrates (e.g., substrate 686), vias for inter-coupling such traces disposed on different substrate layers, and/or various types of flexible or rigid cables (e.g., polyimide tape having conductive traces formed thereon).

Still referring to FIG. 6, memory system 680 may include only a single module slot (e.g., "Module Slot 1") or may include additional module slots (e.g., "Module Slot 2" . . . "Module Slot N") to permit insertion of one or more additional memory modules. In the latter case (multiple module slots), the module control/address links may be coupled in parallel to the memory devices in all populated module slots, while distinct sets of rank control links may be coupled to respective ranks of memory devices within each of the populated module slots (thus, the overall set of rank control links depicted as CSA, CSB for exemplary memory system 680 in which each of the N module slots may be populated with a dual-rank memory module 685). Each set of data-related links may be coupled in parallel to a memory device per rank, so that each individual data-related link is coupled to a number of memory devices (N) equal to the total number of ranks in the memory system.

In exemplary memory system 680, memory read and write operations are carried out with respect to all the devices of a selected rank in parallel. That is, memory controller 681 asserts one of N chip-select signals (i.e., one of CSA, to select the devices of rank A on one of N memory modules, or one of CSB to select the devices of rank B on one of N memory modules) to enable a selected-rank of memory devices 691 to receive a memory access command via the module command/address lines (MCA).

In FIG. 6, each memory module 685 includes a peer termination control bus 689 coupled to each memory device 691 in both rank A and rank B (in all of the ranks on the module which are coupled to the data lines being cooperatively terminated). The peer termination control bus 689 carries termination control signals PTC which are generated by logic on the memory devices 691. Each memory device 691 includes "self" termination logic which is responsive to the operating mode of the memory device 691, and the peer termination control signal PTC which is shared among other memory devices 691 on the module 685, to set the termination impedance for the memory device 691. In addition, each peer memory device 691 includes logic for driving a peer termination control signal PTC on the peer termination control bus 689.

In one embodiment, shown in detail view 693, each memory device 691 within a given rank includes a single memory integrated circuit having control logic 694 that responds to incoming peer termination control signals PTC on the peer termination control bus 689 and chip-select signals (CSA in the example shown as the depicted device is included within memory rank A) by selecting one of three on-die termination states: OFF (i.e., high-impedance or open and thus no termination), R1 (a first termination impedance) or R2 (a second termination impedance). The on-die termination mode selection is depicted conceptually in FIG. 6 by multiplexer 696 and its output selection in response to multiplexer control signal 698 from control logic 694. Other selection circuits may be used in alternative embodiments. Also, as shown, one or more registers 695 may be provided to store the R1 and R2 termination impedance settings, either of which may be disabled (i.e., such that a high impedance is applied). Depending upon the termination mode selection, the appropriate termination setting signals are applied to termination circuit 699 to establish the specified on-die termination at the input of receiver 697. Though not specifically shown, a transmitter (which may include pull-down, pull-up driver elements that form part or all of the termination circuit 699) may also be coupled to the incoming signaling link (e.g., coupled to bidirectional DQ and DQS links) to enable bidirectional signal transmission.

Control logic 694, as mentioned above is responsive to the termination control signals PTC produced by other peer memory devices, and to the operating mode of the memory device 691 to determine the appropriate termination setting signals. In an exemplary embodiment, the control logic 694 can include a state machine, such as a finite state machine, which keeps track of the operating state of the memory device 691.

Figure 7A:
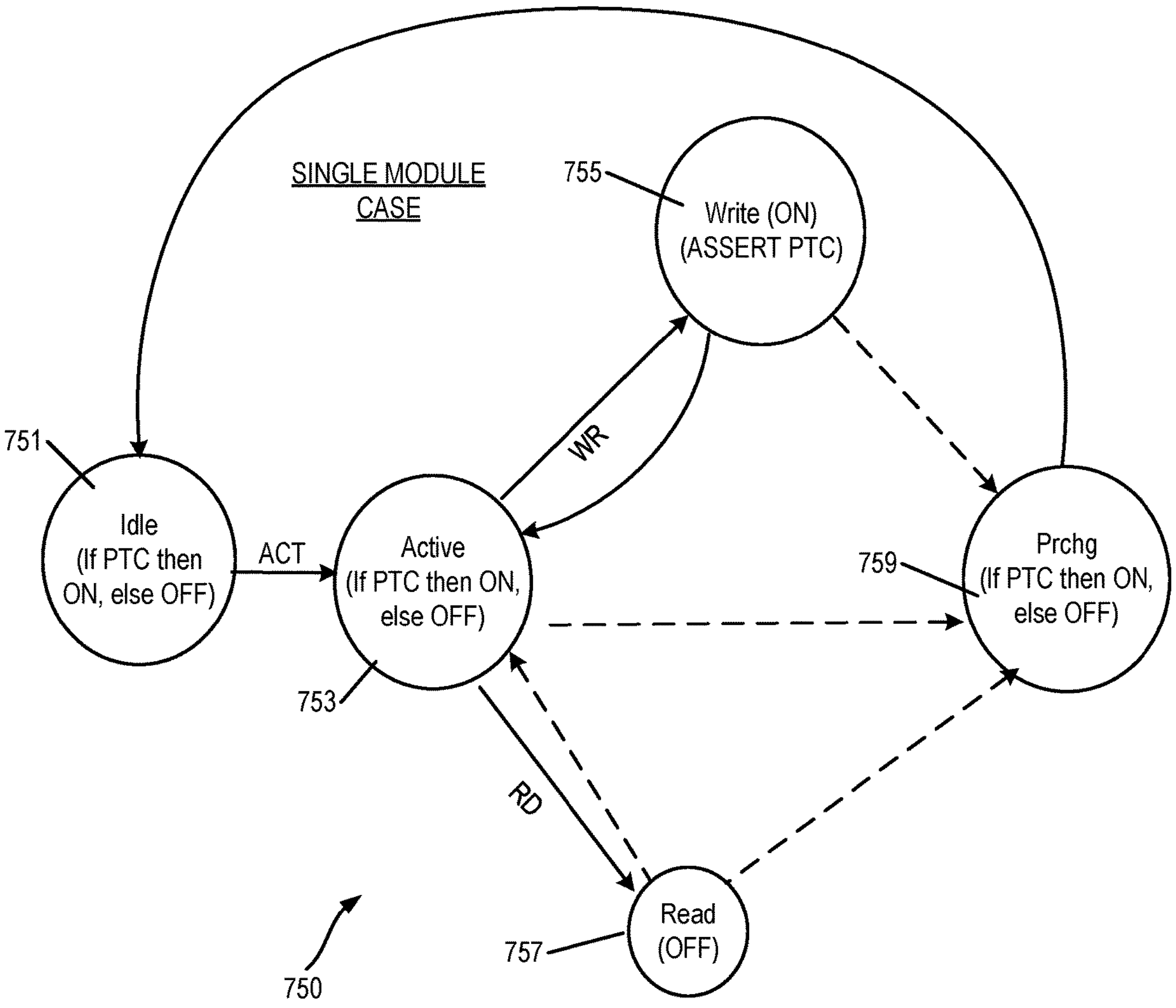
FIG. 7A illustrates an exemplary state diagram of a finite state machine that may be applied within a memory device for a peer termination protocol for a set of devices mounted in proximity.
Figure 7B:
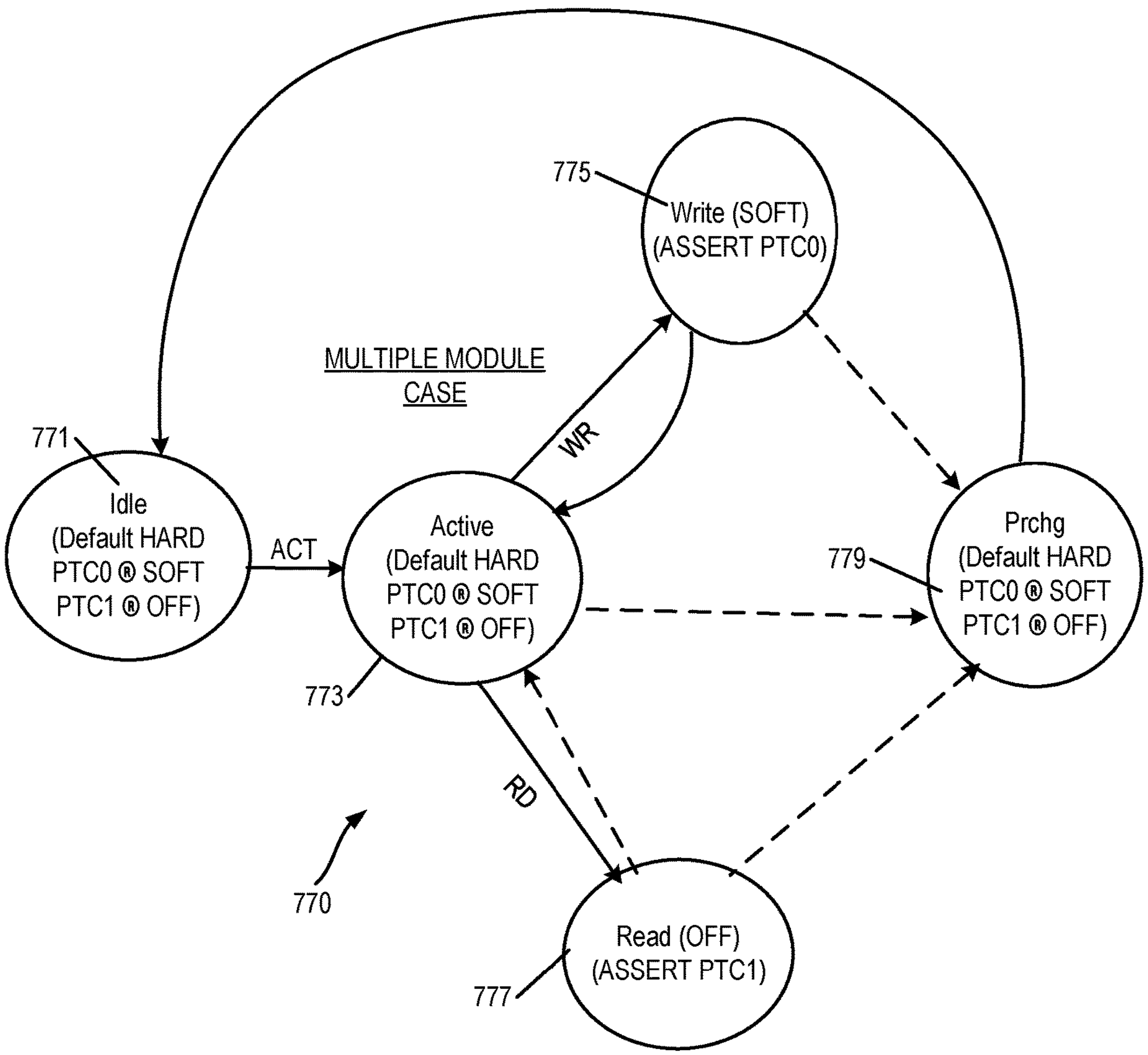
FIG. 7B illustrates an exemplary state diagram of a finite state machine that may be applied within a memory device for a peer termination protocol for a multi-module embodiment.

FIGS. 7A and 7B illustrate basic operation of embodiments of a local on-die termination controller, coupled with circuitry to sense a termination control signal on the termination control bus, circuitry to drive a termination control signal on the termination control bus, and circuitry to effect on-die termination in response to the plurality of operating modes and to termination control signals on the peer termination control bus.

FIG. 7A illustrates an exemplary state diagram 750 of a finite state machine that may be applied within the control logic 694 of a memory device 691 comprising a dynamic random access memory, to effect a desired one of multiple, graduated terminations, for a memory apparatus having a set of peer devices mounted in close proximity, such as on a single module. In an embodiment implementing FIG. 7A, the circuitry to effect on-die termination coupled with the local on-die termination controller includes circuitry to (i) apply a first termination load in a first state, and (ii) disable the on-die termination in a second state.

As shown, the memory devices 691 may initially be in an idle operating state 751 in which no rows of the constituent memory banks are activated. Although not specifically shown, the memory devices may transition between the idle state (or any of the other states shown in FIG. 7A) and various low power states, initialization states, calibration states, configuration states (i.e., for device configuration operations, including setting of programmable registers), refresh states, etc. that are not specifically shown in FIG. 7A.

Because no read or write operation is occurring within the memory devices while in the idle state, in the absence of detection of the assertion of a peer termination control signal PTC, so that memory devices in the idle state 751 will disable termination (OFF). However, if in the idle state 751, another memory device on the same module asserts the peer termination control signal PTC, then memory device in the idle state 751 will effect a cooperative termination (ON).

When an activate command is received within the idle memory rank (i.e., memory rank in which the constituent memory devices are in idle state 751), the constituent memory devices perform respective row activations at the specified row and bank address (and may assume one or more intermediate operating states) and thus transition to active state 753. During the transition to the active state and while in the active state, in the absence of detection of PTC, memory devices in the active state 753 will disable termination (OFF). Assertion of PTC indicates that a memory write transaction is occurring with a peer memory device, but in a different rank, and in such cases, the control logic 694 will effect a cooperative termination (ON).

When a write command is received within an activated rank, the constituent memory devices transition to the write state 755. In the write state 755, the control logic 694 asserts the peer termination control signal PTC on the peer termination control bus for its module, with appropriate timing to enable other devices on the module to adopt the appropriate termination settings, and the memory devices assume the write operating mode in which write data is delivered to the write-state memory rank and cooperative termination (ON) is applied to improve the signaling characteristics over the data path as described above. After the write operation is completed (or multiple successive write operations are completed), the memory device stops asserting the peer termination control signal PTC. Alternatively, the memory device may pulse the termination control signal, and rely on the control logic in the various devices to determine when to exit the soft termination state.

Memory devices in the write state 755 may transition to a precharge state ("Prchg") 759 (e.g., in an auto-precharge mode) or back to the active state 753. In the precharge state 759, the memory devices of the memory rank perform operations to close the open bank and precharge internal signal lines in preparation for a subsequent activation operation. Termination is disabled (OFF) in the precharge state 759 unless assertion of PTC is detected, indicating that a memory write transaction is occurring with a peer memory device, in which case, the control logic 694 will effect a cooperative termination (ON).

Referring again to active state 753, if a memory read command is received, the memory devices of the memory rank will transition to a read state 757 in which read data is output from the memory devices to a memory controller or other device. Accordingly, during the read state, the memory devices may decouple all termination elements from the data lines, or otherwise disable termination (OFF), on which read data is being driven to avoid undue signal attenuation.

FIG. 7B illustrates an exemplary state diagram 770 of a finite state machine that may be applied within the control logic 694 of a memory device 691 comprising a dynamic random access memory, to effect a desired one of multiple, graduated terminations, for a memory apparatus having a plurality of sets of peer devices, such as in a multiple module configuration. In a multiple module embodiment, the peer termination control signal can include a first peer termination control signal PTC0 asserted by one device undergoing a write operation to its peers and a second peer termination control signal PTC1 asserted by one device undergoing a read operation to its peers. In an embodiment implementing FIG. 7B, the circuitry to effect on-die termination coupled with the local on-die termination controller includes circuitry to (i) apply a first termination load in a first state, (ii) apply a second termination load in a second state, and (iii) disable the on-die termination in a third state.

As shown, the memory devices 691 may initially be in an idle operating state 771 in which no rows of the constituent memory banks are activated. Although not specifically shown, the memory devices may transition between the idle state (or any of the other states shown in FIG. 7B) and various low power states, initialization states, calibration states, configuration states (i.e., for device configuration operations, including setting of programmable registers), refresh states, etc. that are not specifically shown in FIG. 7B.

Because no read or write operation is occurring within the memory devices while in the idle state, in the absence of detection of the assertion of a peer termination control signal (PTC0 or PTC1), detection of information on a control and/or address path that indicates a memory read or write transaction may be inferred to be directed to another set of peer devices.

Detection of an asserted PTC0 indicates that a memory write transaction is occurring with another memory device in the same set of peer devices, but in a different rank, and in such cases, the control logic 694 will effect a soft termination ("R2").

Detection of an asserted PTC1 indicates that a memory read transaction is occurring with another memory device in the same set of peer devices, but in a different rank, and in such cases, the control logic 694 will disable or disconnect the termination.

Thus, memory devices in the idle state 771 will effect a default hard termination HARD ("R1"=RC.times.Rhard). If in the idle state 771, another memory device in the same set of peer devices asserts the peer termination control signal PTC0, then memory device in the idle state 771 will effect a soft termination SOFT ("R2"=RC.times.Rsoft). If in the idle state 771, another memory device on the same set of peer devices asserts the peer termination control signal PTC1, then memory device in the idle state 771 disable termination OFF (high impedance or open circuit).

When an activate command is received within the idle memory rank (i.e., memory rank in which the constituent memory devices are in idle state 771), the constituent memory devices perform respective row activations at the specified row and bank address (and may assume one or more intermediate operating states) and thus transition to active state 773. During the transition to the active state and while in the active state, in the absence of detection of PTC0 and PTC1, termination commands may still be inferred to be directed to other set of peer devices (e.g., because no read or write operations are occurring within the subject memory module) so that memory devices in the active state 773 will effect a default hard termination HARD. If in the active state 773, another memory device in the same set of peer devices asserts the peer termination control signal PTC0, then memory device will effect a soft termination SOFT. If in the active state 773, another memory device on the same set of peer devices asserts the peer termination control signal PTC1, then memory device in the active state 773 disables termination OFF (high impedance or open circuit).

When a write command is received within an activated rank, the constituent memory devices transition to the write state 775. In the write state 775, the control logic 694 asserts the peer termination control signal PTC0 on the peer termination control bus for its set of peer devices, with appropriate timing to enable other devices in the set to adopt the appropriate termination settings, and the memory devices assume the write operating mode in which write data is delivered to the write-state memory rank and a soft termination SOFT is applied to improve the signaling characteristics over the data path as described above. After the write operation is completed (or multiple successive write operations are completed), the memory device stops asserting the peer termination control signal PTC0. Alternatively, the memory device may pulse the termination control signal, and rely on the control logic in the various devices to determine when to exit the soft termination state.

Memory devices in the write state 775 may transition to a precharge state ("Prchg") 779 (e.g., in an auto-precharge mode) or back to the active state 773. In the precharge state 779, the memory devices of the memory rank perform operations to close the open bank and precharge internal signal lines in preparation for a subsequent activation operation. Hard termination HARD is applied in the precharge state 779 unless assertion of PTC0 or PTC1 is detected. If in the precharge state 779, another memory device in the same set of peer devices asserts the peer termination control signal PTC0, then memory device will effect a soft termination SOFT. If in the precharge state 779, another memory device on the same set of peer devices asserts the peer termination control signal PTC1, then memory device in the precharge state 779 disables termination OFF (high impedance or open circuit).

Referring again to active state 773, if a memory read command is received, the memory devices of the memory rank will transition to a read state 777 in which read data is output from the memory devices to a memory controller or other device. In the read state 777, the control logic 694 asserts the peer termination control signal PTC1 on the peer termination control bus for its set of peer devices, with appropriate timing to enable other devices in the set to adopt the appropriate termination settings, and the memory devices assume the read operating mode in which read data is transmitted on the link and termination is disabled OFF. Accordingly, during the read state, the memory devices in the same set of peer devices may decouple all termination elements from the data lines on which read data is being driven to avoid undue signal attenuation. Other sets of peer devices device may apply hard termination during transfer of the read data in accordance with their operating states.

The state diagram 750 of FIG. 7A and the state diagram 770 of FIG. 7B present basic logic structures responsive to commands received by memory devices, that accomplish the "self" termination functions of asserting the peer termination control signals, and reacting to the assertion of the peer termination control signals by peer memory devices during appropriate operating modes to enable cooperative termination on the shared signaling bus. Other configurations of state machines and other types of logic structures can be utilized to perform this function.

Figure 8:
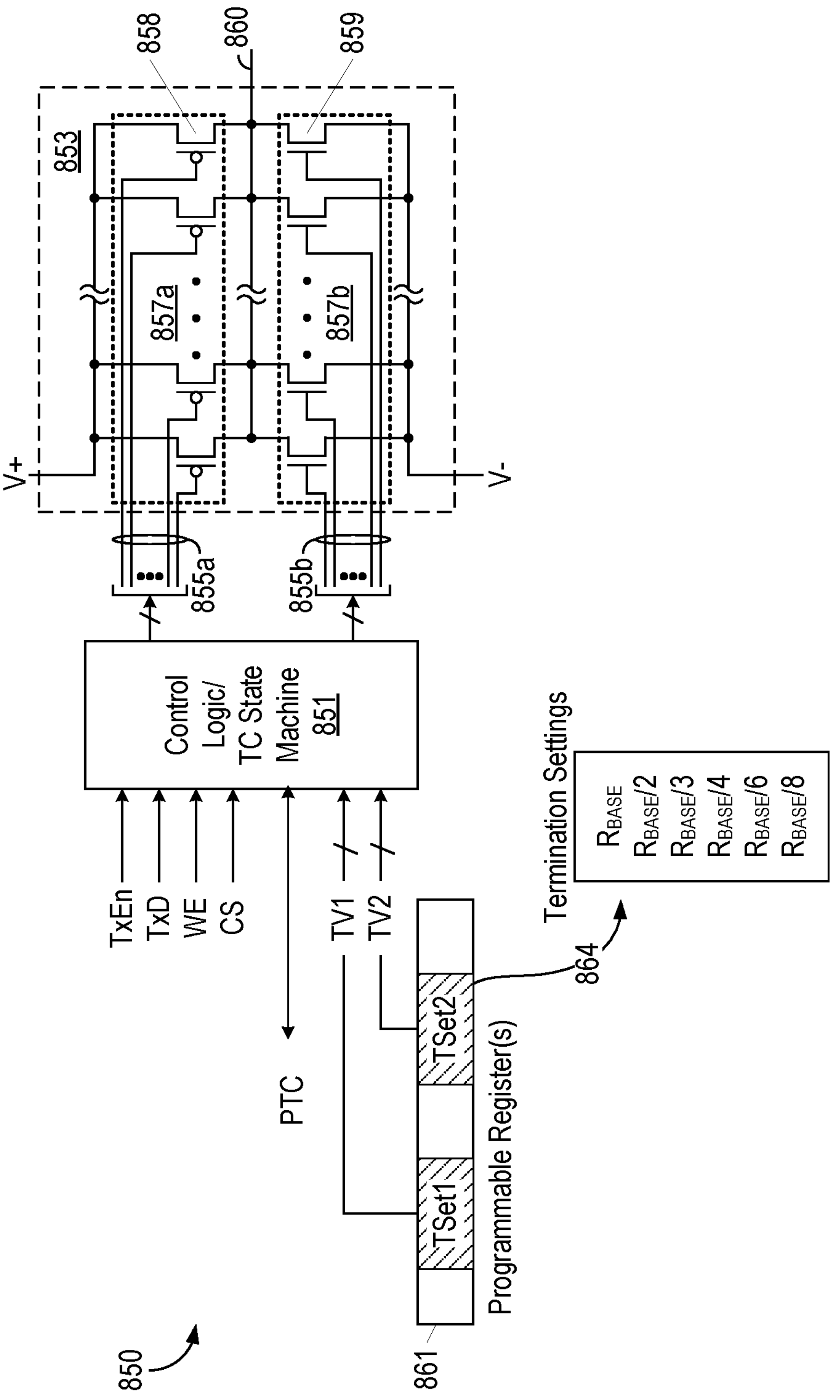
FIG. 8 illustrates an embodiment of a termination/driver circuit that may be used to implement on-die termination circuits described in reference to FIG. 6.

FIG. 8 illustrates an embodiment of a termination/driver circuit 850 that may be used to implement on-die termination circuits described above (e.g., termination circuit 699 of FIG. 6) with local on-die termination control logic 851. As shown, termination/driver circuit 850 includes control logic 851 and link-loading circuit 853 that may serve alternatively as an on-die termination circuit during signal reception and as a signal output driver during signal transmission. The control logic 851 may be included within the control logic elements depicted in FIG. 6 (i.e., element 694 including a state machine) and in the embodiment depicted receives a transmit-enable signal, TxEn, transmit-data signal, TxD, write-enable signal, WE, chip-select signal, CS, peer termination control signal PTC (or peer termination control signals PTC0/PTC1), and termination-value settings, TV1 and TV2. If coupled to a receive-only (unidirectional) signaling link, the transmit-enable and transmit-data signals need not be provided to the control logic (in which case the circuit 850 may serve exclusively as an on-die termination circuit). Also, if termination/driver circuit 850 is to apply a termination load without regard to the state of the chip-select signal or write-enable signal (e.g., and instead based exclusively on the termination control signals), the chip-select and write-enable signals also need not be provided to control logic 851.

Termination/driver circuit 850 performs the role of a push-pull output driver when the transmit-enable signal, TxEn, is asserted, and switches to an on-die termination function when the transmit-enable signal is deasserted. More specifically, when the transmit-enable signal is asserted, the control circuit selectively enables switching elements within pull-up and pull-down switch banks (857*a* and 857*b*) in accordance with the transmit data state (TxD) to establish a desired output signal representative of the transmit data (sourcing or sinking current and thus enabling a signaling current to flow via link input/output (I/O) node 860). When the transmit-enable signal is deasserted, the control circuit selectively enables switching elements within the same pull-up and pull-down switch banks in accordance with the termination control signal(s), termination-value signals and, optionally, the state of the chip-select and write-enable signals, to switchably couple a desired on-die termination load to link I/O node 860.

In the particular embodiment shown, switch bank 857*a* is implemented by a set of P-MOS (P-type metal-oxide-semiconductor) transistors 858 coupled in parallel between link I/O node 860 and the upper supply voltage, V+ (e.g., VDD or VDDIO), while switch bank 857*b* is implemented by a counterpart set of N-MOS (N-type MOS) transistors 859 coupled in parallel between link I/O node 860 and a lower supply voltage, V− (e.g., Ground or VSS or VSSIO). The gates of the P-MOS transistors and N-MOS transistors are controlled by respective enable signals asserted and deasserted on enable-signal lines 855*a*, 855*b* by control logic

851, thus enabling a desired combination of N-MOS and/or P-MOS transistors to be switched to a conducting state (or partially conducting state) and thus establish a desired transmit and/or termination state within the transmit/termination circuit. More specifically, the number of P-MOS transistors switched to a conducting state controls the effective load between the upper supply voltage, V+, and link I/O node 860, so that, if a current-sourcing transmit state is required (e.g., TxEn=1, TxD=1), a predetermined number the P-MOS transistors within switch bank 857*a* may be switched to a conducting state to effect a low or negligible impedance between the upper signaling supply voltage node and the signal I/O node, while all N-MOS transistors within switch bank 857*b* are concurrently switched to a non-conducting state to decouple the lower signaling supply voltage node from the signal I/O node. Conversely, if a current-sinking transmit state is required (e.g., TxEn=1, TxD=0), a predetermined number of the N-MOS transistors may be switched to a conducting state and all the P-MOS transistors may be switched to a non-conducting state. The precise number of N-MOS and P-MOS transistors switched on to establish a given output signal may be fixed, or may be calibrated during system production or system run-time. In the case of calibration, on-chip programmable register(s) 861 (e.g., corresponding to register 695 of FIG. 6) may include fields to store values that control which and/or how many of the transistors within a given switch bank 857*a*, 857*b* are to be enabled during data transmission, thus permitting signal drive strength to be adjusted in run-time calibration operations.

If a non-transmitting mode is signaled (e.g., TxEn=0), but the chip operating mode and other incoming control signals (PTC, CS and/or WE) indicate that on-die termination is to be enabled, control logic 851 transitions to a termination mode by switching a subset of the NMOS transistors 859 within switch bank 857*b* and a subset of the P-MOS transistors 858 within switch bank 857*a* to a conducting state (or to a partially conducting state) to establish a desired on-die termination impedance. In one embodiment, the subsets of N-MOS transistors and P-MOS transistors switched on during the termination mode is controlled by one of the termination-value settings, TV1 and TV2, provided to the control logic 851 and thus by one of the two termination settings (TSet1, TSet2) programmed within register(s) 861. In an embodiment according to FIGS. 6 and 7, for example, termination-value setting TV1 is used to selectively switch on transistors within switch banks 857*a*/857*b* if the termination value R1 is determined by the control logic 851. In such an embodiment, termination-value setting TV2 may be used to selectively switch on transistors within switch banks 857*a*/857*b* if the control logic determines that an alternate on-die termination value is to be applied when a write operation is directed to the memory device. Also, the control logic 851 can cause assertion of the peer termination control signal PTC (or peer termination control signals PTC0/PTC1) when a write operation is directed to the memory device. The control logic may cause on-die termination mode to be disabled (e.g., the OFF state discussed above) as, for example, during memory read operations.

In one embodiment, the termination settings corresponding to termination-value settings TV1 and TV2, may be programmed to be any of a base termination and scaled versions of the base termination as shown at 864 (e.g., base termination $R_{BASE}$ and scaled terminations $R_{BASE/2}$, $R_{BASE/3}$, $R_{BASE/4}$, $R_{BASE/6}$, $R_{BASE/8}$, etc.). As an example, the base termination may be established by turning on a single P-MOS transistor within switch bank 857*a* and a single N-MOS transistor within switch bank 857*b*, with each scaled version of the base termination established by turning on a scaled number of P-MOS and N-MOS transistors (at least in terms of the effective transistor width effected by the multiple switched-on transistors). Thus, $R_{BASE/2}$ may be effected by switching on two transistors in each of banks 857*a* and 857*b*, $R_{BASE/3}$ may be effected by switching on three transistors in each of banks 857*a* and 857*b*, and so forth. Additionally, any or all of the available terminations may be calibrated, for example, by reference to an internal and/or external resistive element (e.g., a precision resistor), in which case, incremental adjustments may be achieved through the precise number of transistors enabled (e.g., a given transistor shown within switch bank 857*a* or 857*b* may be implemented by multiple parallel transistors controlled in part by a common one of enable-signal lines 855*a*/855*b* and in part by respective calibration bits, in effect enabling the number of engage-able parallel transistors to be modulated by the calibration bits).

Still referring to FIG. 8, more or fewer termination settings than shown at 864 may be applied in alternative embodiments, with different or additional factors applied to determine the strength of the termination. Also, either or both of the termination settings TSet1 and TSet2 may be restricted to a subset of the complete set of termination settings. The precise termination value to be applied under a given state of the signaling system may be established by selection of one of a fixed number of permissible enable-signal combinations, or through production-time or run-time testing (calibration). For example, one of a fixed number of termination settings may be determined during production-time or run-time (or pre-selected) and programmed within one or more other fields of registers 861 by a control device such as a programmed-processor. Alternatively, a signal quality metric may be evaluated for different termination settings to enable identification and selection of termination setting(s) that yield a maximized (or near-maximized) value of the metric. Further, though the individual transistors (or other switching elements) within either one of switch banks 857*a* or 857*b* are depicted as being identical, the transistors controlled by respective enable-signal lines 375*a*, 375*b* may be differently sized (e.g., having differently-sized footprints and/or formed by different numbers of ganged transistors having commonly coupled gates) to establish a set of weighted switching transistors. For example a set of N binary-weighted switching transistors (the smallest having unit size ‘x’, followed by transistors having sizes 2x, 4x, 8x, . . . , $2^N-1$x) may be provided and controlled by respective enable-signals to enable selection of $2^N-1$ different impedance settings.

In an alternative embodiment, the control logic and a memory device could be adapted to operate in response to a setting in the programmable registers 861 to implement “self” termination as shown in FIG. 8, without explicit termination control signal from the memory controller, or to operate with memory controller-directed termination as described above with reference to FIGS. 2A-2E, 3A-3B and FIGS. 4A-4D.

Figure 9:
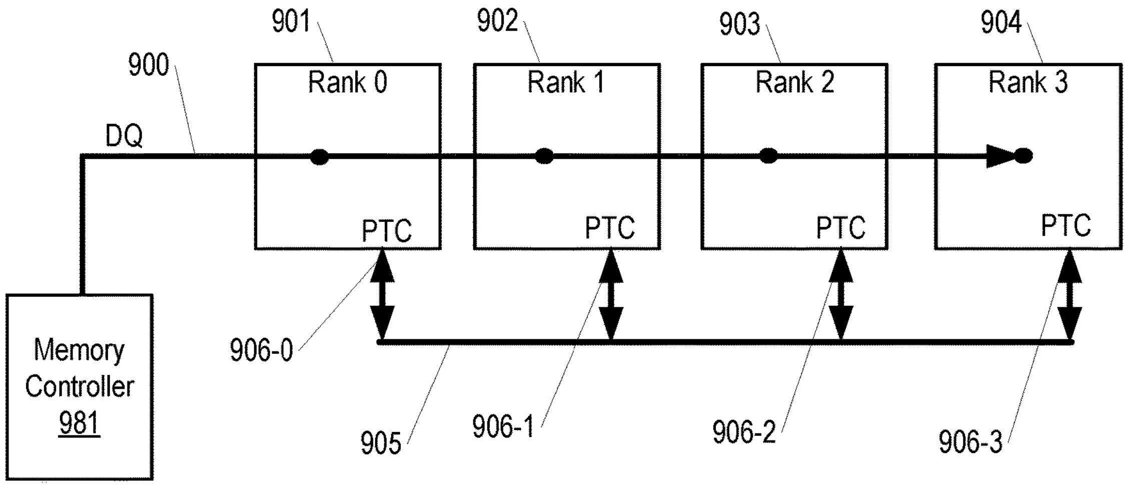
FIG. 9 is a simplified diagram of one configuration for implementation of a module bus for a peer termination control signal PTC.
Figure 10:
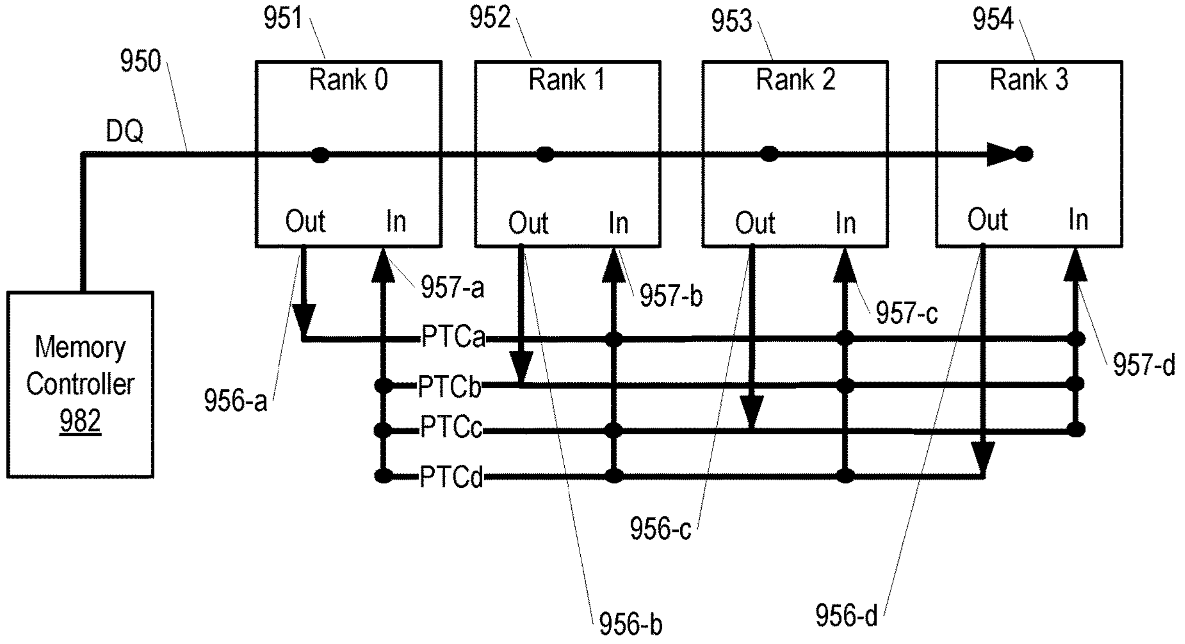
FIG. 10 is a simplified diagram of another configuration for implementation of a peer termination control signal PTC.

FIGS. 9 and 10 illustrate alternative configurations for the peer termination control bus implemented on memory modules such as bus 689 shown in FIG. 6. In FIG. 9, an example showing four ranks, rank O-rank 3, is illustrated with a memory controller 981 and a shared signaling bus, such as a data line 900 connected between the memory controller 981 and one or more memory devices 901-904 in the multiple ranks on the module. In the configuration shown in FIG. 9, each of the memory devices 901-904 within each rank, rank 0-rank 3, has an input/output interface 906-0 to 906-3 with one or two pins for example, used for the PTC signal or PTC signals, and coupled to the peer termination control bus 905. The single input/output interface 906-0 to 906-3 can be implemented for example using a single input/output for both transmitting the PTC signal or signals to other ranks on the module, and receiving the PTC signal or signals from other ranks. The input/output interface 906-0 to 906-3 in this example can be configured in a receive mode by default, transmitting only when write data is expected under control of the local controller as described above. In this example, the PTC signal or signals may be pulsed (i.e. not driven for a full data burst) in order to avoid conflicts on peer termination control bus 905 when switching between transactions for different ranks. In some embodiments, there is no requirement for termination control signals originating from the controller.

In FIG. 10, an example showing four ranks, rank 0-rank 3, is illustrated with a memory controller 982 and a shared signaling bus, such as a data line 950 connected between the memory controller 982 and one or more memory devices 951-954 in the multiple ranks. In the configuration shown in FIG. 10, each of the memory devices 951-954 within each rank, rank D-rank 3, has an output interface 956-*a* to 956-*d* used for driving a PTC signal or signals (PTCa, PTCb, PTCc, PTCd, respectively) to the other memory devices (or other ranks) sharing the data line 950, and an input interface 957-*a* to 957-*d* used for receiving PTC signals from the other memory devices (or other ranks). As shown in the diagram, the output interface 956-*a* on memory device 951 in rank 0 is coupled in a wired-OR configuration to the input interfaces 957-*b*, 957-*c* and 957-*d* on the memory devices 952, 953 and 954, in ranks 1, 2 and 3. The output interface 956-*b* on memory device 952 in rank 1 is coupled in a wired-OR configuration to the input interfaces 957-*a*, 957-*c* and 957-*d* on the memory devices 951, 953 and 954, in ranks 0, 2 and 3. The output interface 956-*c* on memory device 953 in rank 2 is coupled in a wired-OR configuration to the input interfaces 957-*a*, 957-*b* and 957-*d* on the memory devices 951, 952 and 954, in ranks 0, 1 and 3. The output interface 956-*d* on memory device 954 in rank 3 is coupled in a wired-OR configuration to the input interfaces 957-*a*, 957-*b* and 957-*c* on the memory devices 951, 952 and 953, in ranks 0, 2 and 3.

A memory device is described having an on-die termination circuit selectively activated to terminate a data terminal (which can be used for input, output or both), where activation is affected by termination control signal received at an on-die termination control terminal electrically coupled to one or other memory devices that share the data terminal In addition, a memory device is described having a local on-die termination control circuit responsive to commands received by the memory device to activate the on-die termination circuit, and to assert a termination control signal for other memory devices on the same module or same set of peer devices, sharing the data terminal subject of the termination.

A memory module is described including a plurality of ranks of memory devices having selectively activated on-die termination circuit and control circuits as described above, and with a peer termination control bus including one or more transmission lines on a substrate coupled to the memory devices on the module, where the peer termination control bus need not be coupled to the memory controller.

The technology described herein enables the peer memory devices on a module, or otherwise sharing a data line, to achieve "self" termination, without requiring explicit signaling of on die termination control signals from the memory controller.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. In other instances, well-known circuits and devices are shown in block diagram form to avoid obscuring the present invention unnecessarily. Additionally, links or other interconnection between integrated circuit devices or internal circuit elements or blocks may be shown as buses or as single signal lines. Each of the buses may alternatively be a single signal line, and each of the single signal lines may alternatively be buses. Signals and signaling links, however shown or described, may be single-ended or differential. A signal driving circuit is said to "output" a signal to a signal receiving circuit when the signal driving circuit asserts (or deasserts, if explicitly stated or indicated by context) the signal on a signal line coupled between the signal driving and signal receiving circuits. The expression "timing signal" is used herein to refer to a signal that controls the timing of one or more actions within an integrated circuit device and includes clock signals, strobe signals and the like. "Clock signal" is used herein to refer to a periodic timing signal used to coordinate actions between circuits on one or more integrated circuit devices. "Strobe signal" is used herein to refer to a timing signal that transitions to mark the presence of data at the input to a device or circuit being strobed and thus that may exhibit periodicity during a burst data transmission, but otherwise (except for transition away from a parked condition or other limited pre-amble or post-amble transition) remains in a steady-state in the absence of data transmission. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement.

While the invention has been described with reference to specific embodiments thereof, it will be evident that various modifications and changes may be made thereto without departing from the broader spirit and scope. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A memory module comprising:

a module connector having a data contact to communicate write data and read data and control contacts to communicate module commands and addresses, a first termination-control signal, and a second termination-control signal, the data contact exhibiting a termination impedance;

a first rank of memory devices, each memory device in the first rank of memory devices including:

a first termination circuit coupled to the data contact to apply a first controlled impedance; and first control logic coupled to the control contacts and the first termination circuit, the first control logic to control the first termination circuit;

the first control logic to select the first controlled impedance responsive to a first logical combination of the first termination-control signal and the second termination control signal; and a second rank of memory devices, each memory device in the second rank of memory devices including:

a second termination circuit coupled to the data contact to apply a second controlled impedance; and second control logic coupled to the control contacts and the second termination circuit, the second control logic to control the second termination circuit;

the second control logic to select the second controlled impedance responsive to a second logical combination of the first termination-control signal and the second termination control signal.

2. The memory module of claim 1, wherein the termination impedance of the data contact is a function of the first controlled impedance and the second controlled impedance.

3. The memory module of claim 2, wherein the first controlled impedance and the second controlled impedance are adjustable.

4. The memory module of claim 3, wherein each of the memory devices in the first rank of memory devices includes a register to a first value for the first controlled impedance and a second value for the second controlled impedance.

5. The memory module of claim 4, wherein the values select the first controlled impedance from among a high impedance, a first termination impedance, and a second termination impedance.

6. The memory module of claim 5, wherein the high impedance consists essentially of an open circuit.

7. The memory module of claim 1, wherein the first controlled impedance differs from the second controlled impedance responsive to a shared combination of the first termination-control signal and the second termination-control signal.

8. The memory module of claim 1, wherein the first logical combination is the second logical combination.

9. The memory module of claim 1, wherein each of the memory devices in the first rank of memory devices and the second rank of memory devices comprises dynamic random-access memory.

10. A memory module comprising:

a first memory device having a first data port to communicate first data, a first termination-control port to receive a first termination-control signal, and a second termination-control port to receive a second termination-control signal, the first data port exhibiting a first termination impedance responsive to the first termination-control signal and the second termination-control signal; and a second memory device having a second data port to communicate second data, a third termination-control port to receive the first termination-control signal, and a fourth termination-control port to receive the second termination-control signal, the second data port exhibiting a second termination impedance responsive to the first termination-control signal and the second termination-control signal.

11. The memory module of claim 10, the memory module including a rank of memory devices, the rank of memory devices including the first and second memory devices.

12. The memory module of claim 11, wherein the first termination-control port and the second termination-control port connect to the memory devices in the rank of memory devices.

13. The memory module of claim 10, wherein the first memory device comprises dynamic random-access memory.

14. The memory module of claim 10, wherein a first termination impedance and the second termination impedance are adjustable.

15. The memory module of claim 10, the first data port and the second data port exhibiting a third impedance greater than the first termination impedance and the second termination impedance, the third impedance selected responsive to a combination of the first termination-control signal and the second termination-control signal.

16. The memory module of claim 15, wherein the first termination-control signal and the second termination-control signal are binary signals.

17. A method of conveying write data to a first device on a memory module over a data link connected to the first memory device and a second memory device on the memory module, each of the first memory device and the second memory device having a first termination-control port to receive a first termination-control signal and a second termination-control port to receive a second termination-control signal, the method comprising:

sending a first combination of the first termination-control signal and the second termination-control signal to the first memory device, wherein the first combination applies a first impedance to the data link, wherein the data link exhibits a termination impedance that is a function of the first impedance;

sending a second combination of the first termination-control signal and the second termination-control signal to the second memory device, wherein the second combination applies a second impedance to the data link, wherein the termination impedance is a function of the second impedance; and sending the write data to the first device with the data link set to the termination impedance.

18. The method of claim 17, wherein the first termination-control signal and the second termination-control signal are binary signals.

19. The method of claim 18, wherein the first combination of the first termination-control signal and the second termination-control signal asserts at least one of the first termination control signal and the second termination control signal.

20. The method of claim 19, wherein the second combination of the first termination-control signal and the second termination-control signal deasserts the at least one of the first termination-control signal and the second termination-control signal.

* * * * *